United States Patent
Wang et al.

(10) Patent No.: US 10,804,167 B2
(45) Date of Patent: Oct. 13, 2020

(54) METHODS AND SYSTEMS FOR CO-LOCATED METROLOGY

(71) Applicant: KLA-Tencor Corporation, Milpitas, CA (US)

(72) Inventors: David Y. Wang, Santa Clara, CA (US); Esen Salcin, Tempe, AZ (US); Michael Friedmann, Mountain View, CA (US); Derrick Shaughnessy, San Jose, CA (US); Andrei V. Shchegrov, Campbell, CA (US); Jonathan M. Madsen, Los Altos, CA (US); Alexander Kuznetsov, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/257,066

(22) Filed: Jan. 24, 2019

(65) Prior Publication Data
US 2020/0243400 A1   Jul. 30, 2020

(51) Int. Cl.
*H01L 21/66* (2006.01)
*G03F 7/20* (2006.01)
(Continued)

(52) U.S. Cl.
CPC .............. *H01L 22/12* (2013.01); *G01B 11/02* (2013.01); *G01N 21/211* (2013.01);
(Continued)

(58) Field of Classification Search
CPC ..... H01L 22/12; G01B 11/02; G01B 2210/56; G01N 21/211; G01N 21/9501; G03F 7/70633; G06N 3/02
See application file for complete search history.

(56) References Cited

U.S. PATENT DOCUMENTS 5,166,752 A   11/1992   Spanier et al.
5,608,526 A   3/1997   Piwonka-Corle et al.
(Continued)

FOREIGN PATENT DOCUMENTS

WO   2014186768 A1   11/2014

OTHER PUBLICATIONS

International Search Report dated May 20, 2020, for PCT Application No. PCT/US2020/013767. Filed on Jan. 16, 2020 by KLA Corporation, 4 pages.

*Primary Examiner* — Deoram Persaud
(74) *Attorney, Agent, or Firm* — Spano Law Group; Joseph S. Spano

(57) ABSTRACT

Methods and systems for performing co-located measurements of semiconductor structures with two or more measurement subsystems are presented herein. To achieve a sufficiently small measurement box size, the metrology system monitors and corrects the alignment of the measurement spot of each metrology subsystem with a metrology target to achieve maximum co-location of the measurement spots of each metrology subsystem with the metrology target. In another aspect, measurements are performed simultaneously by two or more metrology subsystems at high throughput at the same wafer location. Furthermore, the metrology system effectively decouples simultaneously acquired measurement signals associated with each measurement subsystem. This maximizes signal information associated with simultaneous measurements of the same metrology by two or more metrology subsystems.

63 Claims, 7 Drawing Sheets

(51) Int. Cl.
　　　*G01N 21/95*　　　(2006.01)
　　　*G01B 11/02*　　　(2006.01)
　　　*G06N 3/02*　　　(2006.01)
　　　*G01N 21/21*　　　(2006.01)

(52) U.S. Cl.
　　　CPC ..... *G01N 21/9501* (2013.01); *G03F 7/70633* (2013.01); *G06N 3/02* (2013.01); *G01B 2210/56* (2013.01)

(56) References Cited

U.S. PATENT DOCUMENTS

| | | |
|---|---|---|
| 5,808,738 A | 9/1998 | Garcia-Rubio |
| 5,859,424 A | 1/1999 | Norton et al. |
| 6,429,943 B1 | 8/2002 | Opsal et al. |
| 6,483,580 B1 | 11/2002 | Xu et al. |
| 6,633,831 B2 | 10/2003 | Nikoonahad et al. |
| 6,734,967 B1 | 5/2004 | Piwonka-Corle et al. |
| 6,806,951 B2 | 10/2004 | Wack et al. |
| 6,816,570 B2 | 10/2004 | Janik et al. |
| 6,859,278 B1 | 2/2005 | Johs et al. |
| 6,895,075 B2 | 5/2005 | Yokhin et al. |
| 6,972,852 B2 | 12/2005 | Opsal et al. |
| 7,478,019 B2 | 1/2009 | Zangooie et al. |
| 7,656,528 B2 | 2/2010 | Abdulhalim et al. |
| 7,751,046 B2 | 7/2010 | Levy et al. |
| 7,755,764 B2 | 7/2010 | Kwak et al. |
| 7,826,071 B2 | 11/2010 | Shchegrov et al. |
| 7,907,264 B1 | 3/2011 | Krishnan |
| 7,929,667 B1 | 4/2011 | Zhuang et al. |
| 7,933,026 B2 | 4/2011 | Opsal et al. |
| 8,860,937 B1 | 10/2014 | Dziura et al. |
| 9,146,156 B2 | 9/2015 | Zhuang et al. |
| 9,291,554 B2 | 3/2016 | Kuznetsov et al. |
| 9,310,290 B2 | 4/2016 | Wang et al. |
| 9,915,522 B1 | 3/2018 | Jiang et al. |
| 2004/0207845 A1 | 10/2004 | Opsal et al. |
| 2004/0239947 A1 | 12/2004 | DeGroot et al. |
| 2005/0041257 A1 | 2/2005 | Evans |
| 2005/0254049 A1 | 11/2005 | Zhao et al. |
| 2005/0254050 A1* | 11/2005 | Fielden ............... G01J 3/10 356/369 |
| 2012/0250032 A1 | 10/2012 | Wilde et al. |
| 2013/0114085 A1 | 5/2013 | Wang et al. |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2014/0316730 A1 | 10/2014 | Shohegrov et al. |
| 2014/0375983 A1 | 12/2014 | Wolf et al. |
| 2015/0042984 A1 | 2/2015 | Pandev et al. |
| 2015/0046118 A1 | 2/2015 | Pandev et al. |
| 2015/0193926 A1 | 7/2015 | Berlatzky et al. |
| 2015/0204664 A1 | 7/2015 | Bringoltz et al. |
| 2015/0285735 A1 | 10/2015 | Wang et al. |
| 2016/0139032 A1 | 5/2016 | Rampoldi et al. |
| 2016/0161245 A1 | 6/2016 | Fu et al. |
| 2017/0205342 A1 | 7/2017 | Krishnan et al. |
| 2017/0356800 A1 | 12/2017 | Krishnan et al. |
| 2018/0088040 A1 | 3/2018 | Krishnan et al. |

* cited by examiner

METHODS AND SYSTEMS FOR CO-LOCATED METROLOGY

TECHNICAL FIELD

The described embodiments relate to metrology systems and methods, and more particularly to methods and systems for improved measurement of semiconductor structures.

BACKGROUND INFORMATION

Semiconductor devices such as logic and memory devices are typically fabricated by a sequence of processing steps applied to a specimen. The various features and multiple structural levels of the semiconductor devices are formed by these processing steps. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition, overlay and other parameters of nanoscale structures.

Measurements of a structure of interest are often performed sequentially using multiple metrology techniques to increase measurement accuracy and precision. In some examples, spectroscopic ellipsometry (SE) and spectroscopic reflectometry (SR) systems perform sequential measurements of the same metrology target located on a semiconductor substrate. To perform sequential measurements of a metrology target using different measurement subsystems, each subsystem must be aligned with the metrology target at the time of measurement. This may be achieved by positioning the wafer such that the metrology target is aligned with one measurement subsystem, performing a measurement with that subsystem, then repositioning the wafer such that the same metrology target is aligned with another measurement subsystem. This approach is not desirable in a high throughput metrology setting because the multiple stage moves consume an excessive amount of time. To avoid this problem, in some examples, the measurement beams of multiple metrology systems, such as an SE system and an SR system, are co-located on the same metrology target. In this approach, both SE and SR measurements are acquired without an intervening move of the substrate by the wafer positioning system (e.g., wafer stage move).

Although, co-location of SR and SE measurement beams increases overall measurement throughput, measurement system drift (e.g., due to temperature drift) introduces errors in the overlap of the SR and SE measurement locations on the semiconductor substrate. To reduce these errors, the SR and SE measurement systems must be calibrated periodically to reposition the location of incidence of the SR and SE measurement beams on the semiconductor wafer such that they achieve maximum co-location.

Currently, the positioning of the SR and SE measurement spots relative to a metrology target are monitored and adjusted manually. In some examples, a human operator examines field images of a metrology target collected by the SR and SE measurement systems and adjusts the SR and SE measurement systems to center the metrology target of interest in the center of the field of view of the SR and SE measurement systems, respectively. Using manual techniques and sufficiently long cycle time, co-location of the positioning of the SR and SE measurement beams is possibly achieved with an accuracy of approximately 10 micrometers or less. Unfortunately, co-location of the positioning of the SE and SR measurement beams often degrades over time due to system drift and other factors. Manual alignment becomes very time consuming and difficult for small size metrology targets (e.g., metrology targets having lateral extent of 15-30 micrometers). This limits the throughput of multiple metrology systems, such as combined SE and SR systems, required to accurately characterize the sample.

In summary, ongoing reductions in feature size and increasing depths of structural features impose difficult requirements on optical metrology systems. Optical metrology systems must meet high precision and accuracy requirements for increasingly complex targets at high throughput to remain cost effective. In this context, speed of data collection by multiple measurement subsystems has emerged as an important factor in the design of optical metrology systems. Thus, improved metrology systems and methods to overcome these limitations are desired.

SUMMARY

Methods and systems for performing co-located measurements of semiconductor structures with two or more measurement subsystems are presented herein. To achieve a sufficiently small measurement box size, the metrology system monitors and corrects the alignment of the measurement spot of each metrology subsystem with a metrology target to achieve maximum co-location of the measurement spots of each metrology subsystem with the metrology target. In general, automated co-location of measurements of semiconductor structures with two or more measurement subsystems enables improved measurement accuracy and throughput, improved measurement subsystem matching, improved tool-to-tool matching, faster tool installation and alignment at the fabrication facility, and extended time between programmed maintenance (i.e., less tool downtime).

In one aspect, the location of a metrology target in a field image associated with a first metrology subsystem and the location of the same metrology target in a field image associated with second metrology subsystem are monitored. When misalignment between the locations of the metrology target in the field images exceeds a predetermined tolerance, the position of one or more elements of the first metrology subsystem, the second metrology subsystem, or both, is automatically adjusted to co-locate the metrology target in both field images within the predetermined tolerance.

In another aspect, the location of a known metrology target in a measurement spot of a first metrology subsystem is estimated directly based on measurements of the known metrology target by the first metrology subsystem. In addition, the location of the known metrology target in a measurement spot of a second metrology subsystem is estimated directly based on measurements of the known metrology target by the second metrology subsystem.

In some embodiments, colocation is evaluated directly based on spectral measurements of a known metrology target that provides a spectral response having a known dependency on alignment with the measurement system. In some examples, the metrology target is a two dimensional, spatially varying pattern target, such as a two dimensional variable period grating or a variable wavelength filter.

In yet another further aspect, the alignment of the measurement spot of a first metrology subsystem with the measurement spot of a second metrology subsystem is achieved by maximizing cross-talk between the two measurement channels during measurement of a specialized metrology target.

In another aspect, the location of a metrology target in the measurement spot of a first metrology subsystem is estimated directly based on a statistical model of measurements of a metrology target by the first metrology subsystem. In addition, the location of the metrology target in the measurement spot of a second metrology subsystem is estimated directly based on a statistical model of measurements of the metrology target by the second metrology subsystem.

In another aspect, misalignment between the measurement spots of two different metrology subsystems is corrected by adjusting a field stop of one, or both, metrology subsystems. Movements of a field stop in a plane perpendicular to the measurement beam path are employed to adjust misalignment at the wafer plane, and movements of the field stop in a direction aligned with the measurement beam path are employed to adjust focal misalignment.

In another aspect, misalignment between measurement spots of two different metrology subsystems is corrected by adjusting an illumination pupil of one of the metrology subsystems.

In another aspect, an optical element of a metrology subsystem is actuated to tip/tilt the pupil to shift the direction of beam propagation. An objective transforms the shift in direction of beam propagation into an XY displacement of the measurement beam at the wafer.

In another aspect, measurements are performed simultaneously by two or more metrology subsystems at high throughput at the same wafer location. Furthermore, the metrology system effectively decouples simultaneously acquired measurement signals associated with each measurement subsystem. This maximizes signal information associated with simultaneous measurements of the same metrology by two or more metrology subsystems.

In some embodiments, a deep learning model (e.g., neural network model, support vector machines model, etc.) is trained to reduce crosstalk between signals simultaneously measured on the SE and SR measurement channels. Model training may be based on actual measurement data, synthetic measurement data (i.e., simulated measurement data), or both.

In some embodiments, separate illumination wavelengths are employed to decouple simultaneously measured signals present at the detectors of two or more measurement channels.

In another aspect, the location of a metrology target in a field image of a first metrology subsystem and the location of the metrology target in a field image of a second metrology subsystem are colocated at all times based on the mechanical alignment and stability of the combined metrology system.

The foregoing is a summary and thus contains, by necessity, simplifications, generalizations and omissions of detail; consequently, those skilled in the art will appreciate that the summary is illustrative only and is not limiting in any way.

Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Methods and systems for performing co-located measurements of semiconductor structures with two or more measurement subsystems are presented herein. In some embodiments, a metrology system includes a spectroscopic reflectometer (SR) subsystem and a spectroscopic ellipsometer (SE) subsystem. In some embodiments, a metrology system includes two SE subsystems each arranged to perform measurements at different azimuth angles (e.g., zero degrees and ninety degrees). In some embodiments, a metrology system includes a SE subsystem and an angle resolved reflectometer subsystem (e.g., a two dimensional beam profile reflectometer). In some embodiments, a metrology system includes a SE subsystem and an imaging based metrology subsystem, such as a hyperspectral imaging based metrology subsystem. To achieve a sufficiently small measurement box size, the metrology system monitors and corrects the alignment of the measurement spot of each metrology subsystem with a metrology target to achieve maximum co-location of the measurement spots of each metrology subsystem with the metrology target.

In some embodiments, measurements are performed sequentially by two or more metrology subsystems at high throughput at the same wafer location. In some embodiments, measurements are performed simultaneously measured by two or more metrology subsystems at high throughput at the same wafer location. Furthermore, the metrology system effectively decouples simultaneously acquired measurement signals associated with each measurement subsystem. This maximizes signal information associated with simultaneous measurements of the same metrology by two or more metrology subsystems. These features, individually, or in combination, enable measurement of structures having small lateral dimensions and measurement of high aspect ratio structures (e.g., structures having depths of one micrometer or more) with high throughput, precision, and accuracy.

In general, automated co-location of measurements of semiconductor structures with two or more measurement subsystems enables improved measurement accuracy and throughput, improved measurement subsystem matching, improved tool-to-tool matching, faster tool installation and alignment at the fabrication facility, and extended time between programmed maintenance (i.e., less tool downtime).

Figure 1:
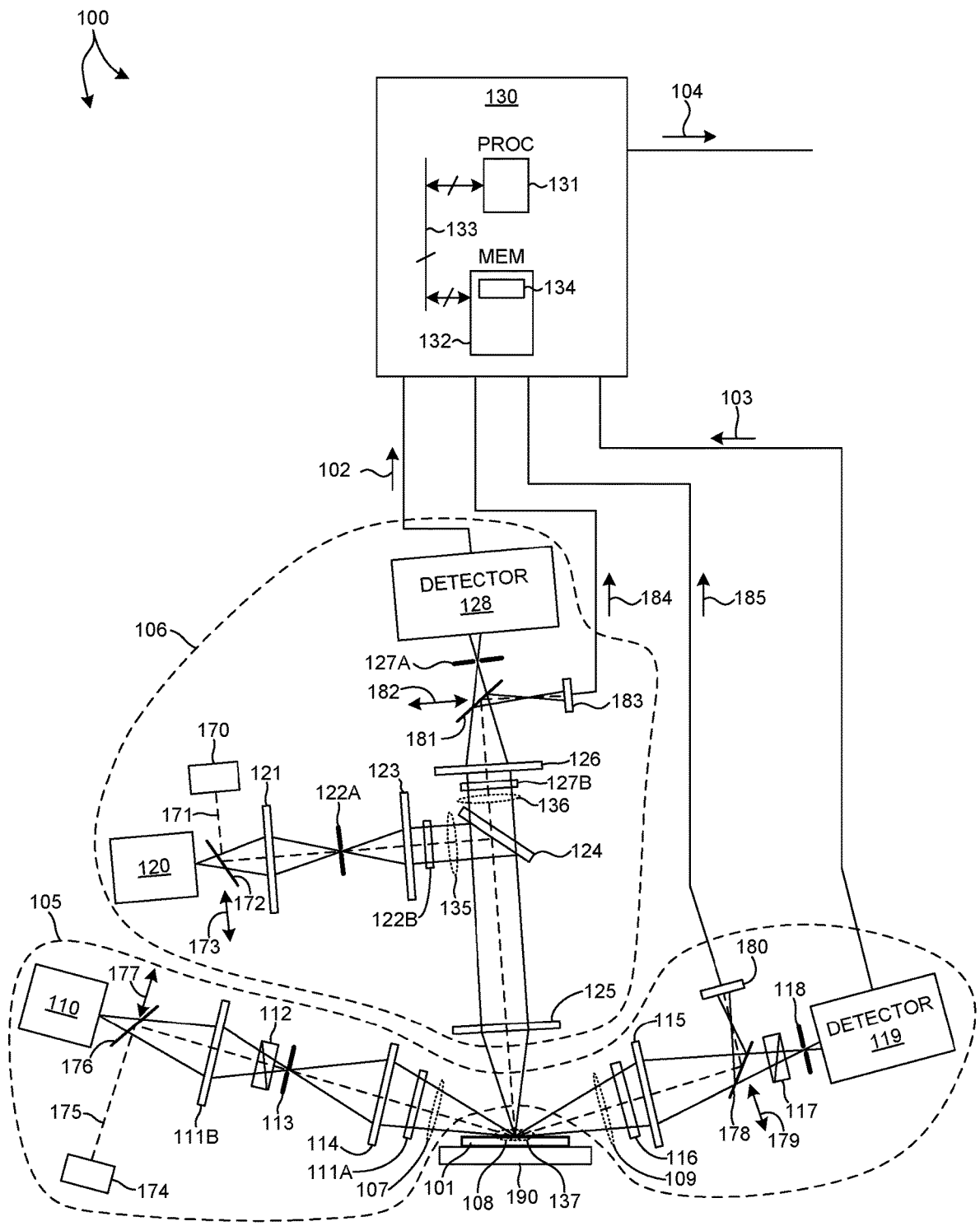
FIG. 1 depicts an exemplary, metrology system 100 for performing colocated measurements of semiconductor structures by multiple metrology subsystems in one embodiment.

FIG. 1 depicts an exemplary, combined SE-SR metrology system 100 for performing SE and SR measurements of semiconductor structures. In some examples, the one or more structures include at least one high aspect ratio (HAR) structure or at least one large lateral dimension structure. As depicted in FIG. 1, metrology system 100 includes a spectroscopic ellipsometer (SE) subsystem 105 and a spectroscopic reflectometer (SR) subsystem 106.

SE subsystem 105 includes an illumination source 110 that generates a beam of illumination light 107 incident on wafer 101. In some embodiments, illumination source 110 is a broadband illumination source that emits illumination light in the ultraviolet, visible, and infrared spectra. In one embodiment, illumination source 110 is a laser sustained plasma (LSP) light source (a.k.a., laser driven plasma source). The pump laser of the LSP light source may be continuous wave or pulsed. A laser-driven plasma source can produce significantly more photons than a Xenon lamp across the entire wavelength range from 150 nanometers to 2,500 nanometers. Illumination source 110 can be a single light source or a combination of a plurality of broadband or discrete wavelength light sources. The light generated by illumination source 110 includes a continuous spectrum or parts of a continuous spectrum, from ultraviolet to infrared (e.g., vacuum ultraviolet to mid infrared). In general, illumination light source 110 may include a super continuum laser source, an infrared helium-neon laser source, an arc lamp, a globar source, or any other suitable light source.

In a further aspect, the amount of illumination light is broadband illumination light that includes a range of wavelengths spanning at least 500 nanometers. In one example, the broadband illumination light includes wavelengths below 250 nanometers and wavelengths above 750 nanometers. In general, the broadband illumination light includes wavelengths between 120 nanometers and 4,200 nanometers. In some embodiments, broadband illumination light including wavelengths beyond 4,200 nanometers may be employed. In some embodiments, illumination source 110 includes a deuterium source emitting light with wavelengths across a range from 150 nanometers to 400 nanometers, a LSP source emitting light with wavelengths across a range from 180 nanometers to 2,500 nanometers, a supercontinuum source emitting light with wavelengths across a range from 800 nanometers to 4,200 nanometers, and a globar source emitting light with wavelengths across a range from 2,000 nanometers to 20,000 nanometers.

As depicted in FIG. 1, SE subsystem 105 includes an illumination subsystem configured to direct illumination light 107 to one or more structures formed on the wafer 101. The illumination subsystem is shown to include light source 110, illumination optics 111A, one or more optical filters 111B, polarizing component 112, illumination field stop 113, and illumination pupil aperture stop 114. As depicted, in FIG. 1, the beam of illumination light 107 passes through illumination optics 111A, optical filter(s) 111B, polarizing component 112, field stop 113, and aperture stop 114 as the beam propagates from the illumination source 110 to wafer 101. Beam 107 illuminates a portion of wafer 101 over a measurement spot 108.

The illumination optics 111A conditions illumination light 107 and focuses illumination light 107 on measurement spot 108. The one or more optical filters 111B are used to control light level, spectral output, or combinations thereof, from the illumination subsystem. In some examples, one or more multi-zone filters are employed as optical filters 111B. Polarizing component 112 generates the desired polarization state exiting the illumination subsystem. In some embodiments, the polarizing component is a polarizer, a compensator, or both, and may include any suitable commercially available polarizing component. The polarizing component can be fixed, rotatable to different fixed positions, or continuously rotating. Although the SE illumination subsystem depicted in FIG. 1 includes one polarizing component, the SE illumination subsystem may include more than one polarizing component. Field stop 113 controls the field of view (FOV) of the illumination subsystem and may include any suitable commercially available field stop. Aperture stop 114 controls the numerical aperture (NA) of the illumination subsystem and may include any suitable commercially available aperture stop. Light from illumination source 110 is focused on one or more structures (not shown in FIG. 1) on wafer 101. The SE illumination subsystem may include any type and arrangement of illumination optics 111A, optical filter(s) 111B, polarizing component 112, field stop 113, and aperture stop 114 known in the art of spectroscopic ellipsometry.

Metrology system 100 also includes a collection optics subsystem configured to collect light generated by the interaction between the one or more structures and the incident illumination beam 107. A beam of collected light 109 is collected from measurement spot 108 by collection optics 115. Collected light 109 passes through collection aperture stop 116, polarizing element 117, and field stop 118 of the collection optics subsystem.

Collection optics 115 includes any suitable optical elements to collect light from the one or more structures formed on wafer 101. Collection aperture stop 116 controls the NA of the collection optics subsystem. Polarizing element 117 analyzes the desired polarization state. The polarizing element 117 is a polarizer or a compensator. The polarizing element 117 can be fixed, rotatable to different fixed positions, or continuously rotating. Although the collection subsystem depicted in FIG. 1 includes one polarizing element, the collection subsystem may include more than one polarizing element. Collection field stop 118 controls the FOV of the collection subsystem. The collection subsystem takes light from wafer 101 and directs the light through collection optics 115, aperture stop 116, and polarizing element 117 to be focused on collection field stop 118. In some embodiments, collection field stop 118 is used as a spectrometer slit for the spectrometers of the detection subsystem. However, collection field stop 118 may be located at or near a spectrometer slit of the spectrometers of the detection subsystem.

The collection subsystem may include any type and arrangement of collection optics 115, aperture stop 116, polarizing element 117, and field stop 118 known in the art of spectroscopic ellipsometry.

In the embodiment depicted in FIG. 1, the collection optics subsystem directs light to detector 119. Detector 119 generates output responsive to light collected from the one or more structures illuminated by the illumination subsystem at measurement spot 108. In one example, detector 119 includes charge coupled devices (CCD) sensitive to ultraviolet and visible light (e.g., light having wavelengths between 190 nanometers and 860 nanometers). In other examples, detector 119 includes a photo detector array (PDA) sensitive to infrared light (e.g., light having wavelengths between 950 nanometers and 2500 nanometers). However, in general, detector 119 may include other detector technologies and arrangements (e.g., a position sensitive detector (PSD), an infrared detector, a photovoltaic detector, a quadrature cell detector, a camera, etc.). Each detector converts the incident light into electrical signals indicative of the spectral intensity of the incident light. In general, detector 119 generates output signals 103 indicative of the light detected on detector 119.

SR subsystem 106 includes an illumination source 120 that generates a beam of illumination light 135 incident on wafer 101. In some embodiments, illumination source 120 is a broadband illumination source that emits illumination light in the ultraviolet, visible, and infrared spectra. In one embodiment, illumination source 120 is a laser sustained plasma (LSP) light source (a.k.a., laser driven plasma source). The pump laser of the LSP light source may be continuous wave or pulsed. A laser-driven plasma source can produce significantly more photons than a Xenon lamp across the entire wavelength range from 150 nanometers to 2,500 nanometers. Illumination source 120 can be a single light source or a combination of a plurality of broadband or discrete wavelength light sources. The light generated by illumination source 120 includes a continuous spectrum or parts of a continuous spectrum, from ultraviolet to infrared (e.g., vacuum ultraviolet to mid infrared). In general, illumination light source 120 may include a super continuum laser source, an infrared helium-neon laser source, an arc lamp, a globar source, or any other suitable light source.

In a further aspect, the amount of illumination light is broadband illumination light that includes a range of wavelengths spanning at least 500 nanometers. In one example, the broadband illumination light includes wavelengths below 250 nanometers and wavelengths above 750 nanometers. In general, the broadband illumination light includes wavelengths between 120 nanometers and 4,200 nanometers. In some embodiments, broadband illumination light including wavelengths beyond 4,200 nanometers may be employed. In some embodiments, illumination source 110 includes a deuterium source emitting light with wavelengths across a range from 150 nanometers to 400 nanometers, a LSP source emitting light with wavelengths across a range from 180 nanometers to 2,500 nanometers, a supercontinuum source emitting light with wavelengths across a range from 800 nanometers to 4,200 nanometers, and a globar source emitting light with wavelengths across a range from 2,000 nanometer to 20,000 nanometers.

In some embodiments, illumination source 110 of SE subsystem 105 and illumination source 120 of SR subsystem 106 are the same illumination source or combination of illumination sources. Sharing a common illumination source or combination of sources across the SE and SR subsystems reduces the number of components, and thus the number of failure modes, and also simplifies spectral calibration across the SE and SR subsystems.

As depicted in FIG. 1, SR subsystem 106 includes an illumination subsystem configured to direct illumination light 135 to the same structure(s) formed on the wafer 101 illuminated by the SE subsystem. The illumination subsystem is shown to include light source 120, one or more optical filters 121, illumination field stop 122A, illumination aperture stop 122B, optics 123, beam splitter 124, and objective 125. As depicted, in FIG. 1, the beam of illumination light 135 passes through optical filter(s) 121, field stop 122A, illumination aperture stop 122B, optics 123, beam splitter 124, and objective 125 as the beam propagates from the illumination source 120 to wafer 101. Beam 135 illuminates a portion of wafer 101 over a measurement spot 137.

The one or more optical filters 121 control light level, spatial output, spectral output, or combinations thereof. In some examples, one or more multi-zone filters are employed as optical filters 121. Field stop 122A controls the field of view (FOV) of the SR illumination subsystem and may include any suitable commercially available field stop. Illumination aperture stop 122B controls the illumination numerical aperture (NA) of the SR illumination subsystem and may include any commercially available aperture stop. Optics 123 direct illumination light toward beam splitter 124. Beam splitter 124 directs a portion of illumination light toward objective 125. Objective 125 focuses illumination light from beam splitter 124 over a measurement spot 137, on one or more structures (not shown in FIG. 1) on wafer 101. The SR illumination subsystem may include any type and arrangement of optical filter(s) 121, illumination field stop 122A, illumination aperture stop 122B, optics 123, beam splitter 124, and objective 125 known in the art of spectroscopic reflectometry.

SR subsystem 106 also includes a collection optics subsystem configured to collect light generated by the interaction between the one or more structures and the incident illumination beam 135. A beam of collected light 136 is collected from measurement spot 137 by objective 125. Collected light 136 passes through beam splitter 124, focusing optics 126, collection aperture stop 127B, and collection field stop 127A of the collection optics subsystem.

Objective 125 includes any suitable optical elements to collect light from the one or more structures formed on wafer 101. In some embodiments, objective 125 includes an aperture stop that controls the NA of the illumination and collection optics subsystem. Collection aperture stop 127B controls collection NA of the collection subsystem. Collection field stop 127A controls the field of view (FOV) of the collection subsystem. The collection subsystem takes light from wafer 101 and directs the light through objective 125, beam splitter 124, focusing optics 126, collection aperture stop 127B, and collection field stop 127A. In some embodiments, collection field stop 127A is used as a spectrometer slit for the spectrometers of the detection subsystem. However, collection field stop 127A may be located at or near a spectrometer slit of the spectrometers of the detection subsystem.

In some embodiments, beam splitter 124, objective 125, or both, may be common to the illumination and collection subsystems. In some embodiments, the illumination and collection subsystems have the same NA. In some embodiments, the illumination subsystem and the collection subsystem have different NA. The collection subsystem may include any type and arrangement of objective 125, beam splitter 124, focusing optics 126, collection aperture stop 127B, and field stop 127A known in the art of spectroscopic reflectometry.

In the embodiment depicted in FIG. 1, the SR collection optics subsystem directs light to detector 128. Detector 128 generates output responsive to light collected from the one or more structures illuminated by the illumination subsystem at measurement spot 137. In one example, detector 128 includes charge coupled devices (CCD) sensitive to ultraviolet and visible light (e.g., light having wavelengths between 190 nanometers and 860 nanometers). In other examples, detector 128 includes a photo detector array (PDA) sensitive to infrared light (e.g., light having wavelengths between 950 nanometers and 2500 nanometers). However, in general, detector 128 may include other detector technologies and arrangements (e.g., a position sensitive detector (PSD), an infrared detector, a photovoltaic detector, a quadrature cell detector, a camera, etc.). Each detector converts the incident light into electrical signals indicative of the spectral intensity of the incident light. In general, detector 128 generates output signals 102 indicative of the light detected on detector 128.

Although, FIG. 1 does not illustrate polarizing components in the illumination path, collection path, or both, of the SR subsystem 106, in general, SR subsystem 106 may include one or more polarizing components in the illumination path, collection path, or both, to enhance the spectroscopic reflectometry measurements performed by SR subsystem 106.

Metrology system 100 also includes computing system 130 configured to receive detected signals 102 and 103 and determine an estimate of a value of a parameter of interest 104 of the measured structure(s) based at least in part on the measured signals. By collecting SR and SE spectra associated with the same structure of interest without an intervening stage move, measurement times are reduced and all spectra are measured with the same alignment conditions. This allows wavelength errors to be corrected more easily because a common correction can be applied to all spectral data sets.

In one aspect, the location of a metrology target in the SE field image and the location of the same metrology target in the SR field image are monitored. When misalignment between the locations of the metrology target in the SE and SR field images exceeds a predetermined tolerance, the position of one or more elements of the SE subsystem, the SR subsystem, or both, is automatically adjusted to co-locate the metrology target in the SE and SR field images within the predetermined tolerance.

In a further aspect, a field image of a metrology target is generated by a SE field imaging device (e.g., CCD camera) located in the collection path of the SE subsystem. Pattern recognition is employed to estimate the location of the metrology target in the SE field image. Similarly, a field image of the metrology target is generated by a SR field imaging device (e.g., CCD camera) located in the collection path of the SR subsystem. Pattern recognition is employed to estimate the location of the metrology target in the SR field image.

In some embodiments, a mirror is selectively positioned in the collection beam path of the SE subsystem, and another mirror is selectively positioned in the collection beam path of the SR subsystem. Each mirror is selectively positioned in or out of each respective beam path by an actuator subsystem (e.g., solenoid, servo, gimbel, etc.). When a mirror is positioned within the SE collection beam path, the mirror redirects the SE collection beam toward a SE field imaging camera. When the mirror is positioned out of the SE collection beam path, the SE collection beam propagates toward the SE spectrometer. Similarly, when a mirror is positioned within the SR collection beam path, the mirror redirects the SR collection beam toward a SR field imaging camera. When the mirror is positioned out of the SR collection beam path, the SR collection beam propagates toward the SR spectrometer.

FIG. 1 also depicts a camera 180 at or near a wafer image plane of the SE subsystem and a camera 183 at or near a wafer image plane of the SR subsystem. As depicted in FIG. 1, a mirror 178 is selectively positioned in the collection beam path of the SE subsystem, and mirror 181 is selectively positioned in the collection beam path of the SR subsystem. Mirror 178 is selectively positioned in or out of the SE collection beam path by an actuator subsystem 179. Similarly, mirror 181 is selectively positioned in or out of the SR collection beam path by an actuator subsystem 182. When mirror 178 is positioned within the SE collection beam path, mirror 178 redirects the SE collection beam toward SE field imaging camera 180. SE field imaging camera 180 communicates signals 185 indicative of the SE field image of SE measurement spot 108 on wafer 101 to computing system 130. When mirror 181 is positioned within the SR collection beam path, mirror 181 redirects the SR collection beam toward SR field imaging camera 183. SR field imaging camera 183 communicates signals 184 indicative of the SR field image of SR measurement spot 137 on wafer 101 to computing system 130.

In the embodiment depicted in FIG. 1, computing system 130 is configured to receive signals 185 indicative of the SE field image of SE measurement spot 108 on wafer 101 detected by camera 180. In the depicted embodiment, computing system 130 employs pattern recognition techniques to identify the position of a structure of interest (e.g., a metrology target) within the measurement spot 108. Similarly, computing system 130 is configured to receive signals 184 indicative of the SR field image of SR measurement spot 137 on wafer 101 detected by camera 183. In the depicted embodiment, computing system 130 employs pattern recognition techniques to identify the position of the same structure of interest (e.g., the same metrology target) within the measurement spot 137.

In addition, computing system 130 determines the misalignment between the locations of the metrology target in the SE field image of measurement spot 108 and the SR field image of measurement spot 137 and also determines whether the misalignment exceeds a predetermined threshold value.

In some examples, computing system 130 determines the misalignment between the measured SE field image of measurement spot 108 with respect to the metrology target and a desired location of the SE field image of measurement spot 108 with respect to the metrology target. If this misalignment exceeds a predetermined threshold value, computing system 130 communicates control commands to one or more elements of SE subsystem 105 that cause SE subsystem 105 to adjust the location of the field image of SE measurement spot 108 with respect to the metrology target to reduce the misalignment below the predetermined threshold value. In addition, computing system 130 determines the misalignment between the measured SR field image of measurement spot 137 with respect to the same metrology target and a desired location of the SR field image of measurement spot 137 with respect to the metrology target. If this misalignment exceeds a predetermined threshold value, computing system 130 communicates control commands to one or more elements of SR subsystem 106 that cause SR subsystem 106 to adjust the location of the SR field image of measurement spot 137 with respect to the metrology target to reduce the misalignment below the predetermined threshold value.

In some other examples, computing system 130 determines the misalignment between the measured SE field image of measurement spot 108 with respect to the metrology target and the measured SR field image of measurement spot 137 with respect to the same metrology target. If this misalignment exceeds a predetermined threshold value, computing system 130 communicates control commands to one or more elements of either SE subsystem 105, SR subsystem 106, or both, that causes SE subsystem 105, SR subsystem 106, or both, to adjust the location of the SE field image of measurement spot 108 with respect to the metrology target, the location of the SR field image of measurement spot 137 with respect to the metrology target, or both, to reduce the misalignment below the predetermined threshold value.

In some embodiments, field images of a metrology target generated by a camera located in the collection path of the SE subsystem are generated by illuminating the metrology target with the illumination beam of the SE measurement subsystem (e.g., beam 107 depicted in FIG. 1). Similarly, field images of the same metrology target generated by a camera located in the collection path of the SR subsystem are generated by illuminating the metrology target with the illumination beam of the SR measurement subsystem (e.g., beam 135 depicted in FIG. 1).

In some other embodiments, field images of a metrology target generated by a camera located in the collection path of the SE subsystem are generated by illuminating the metrology target with an alignment beam different from the illumination beam of the SE measurement subsystem. Similarly, field images of a metrology target generated by a camera located in the collection path of the SR subsystem are generated by illuminating the metrology target with an alignment beam different from the illumination beam of the SR measurement subsystem.

FIG. 1 also depicts a laser beam source 174 that generates an alignment beam 175 directed toward wafer 101 by mirror 176. As depicted in FIG. 1, mirror 176 is selectively positioned in the illumination beam path of the SE subsystem. Mirror 176 is selectively positioned in or out of the SE illumination beam path by an actuator subsystem 177. FIG. 1 also depicts a laser beam source 170 that generates an alignment beam 171 directed toward wafer 101 by mirror 172. As depicted in FIG. 1, mirror 172 is selectively positioned in the illumination beam path of the SR subsystem. Mirror 172 is selectively positioned in or out of the SR illumination beam path by an actuator subsystem 173.

In some other embodiments, a common laser beam source is employed to generate alignment beams injected into the illumination beam paths of both the SR and SE subsystems.

In some embodiments, elements 176 and 178 are dichroic mirror elements that transmit illumination beam 107 and reflect alignment beam 175. Similarly, elements 172 and 181 are dichroic mirror elements that transmit illumination beam 135 and reflect alignment beam 171. In other embodiments, SE/SR paths and alignment paths can be separate paths without elements, 176, 178, 172, and 182. In some embodiments, alignment beams 171 and 175 are temporally separated from illumination beams 135 and 107, respectively, by optical modulation. In these embodiments colocation of SE and SR measurement spots is evaluated at instances that are temporally separated from SE and SR measurements.

In some embodiments, an optical chopper is located in the illumination beam path between illumination source 110 and mirror element 176, and another optical chopper is located in the alignment beam path between laser beam source 174 and mirror element 176. The optical choppers are synchronized such that either illumination beam 107 or alignment beam 175 is transmitted to wafer 101. Similarly, an optical chopper is located in the illumination beam path between illumination source 120 and mirror element 172, and another optical chopper is located in the alignment beam path between laser beam source 170 and mirror element 172. The optical choppers are synchronized such that either illumination beam 135 or alignment beam 171 is transmitted to wafer 101.

In some other embodiments, illumination source 110 and laser beam source 174 are pulsed sources synchronized such that either the illumination beam 107 or the alignment beam 175 is transmitted to wafer 101. Similarly, illumination source 120 and laser beam source 170 are pulsed sources synchronized such that either illumination beam 135 or alignment beam 171 is transmitted to wafer 101.

In some embodiments, alignment beams 171 and 175 are separated from illumination beams 135 and 107, respectively, by wavelength. In these embodiments colocation of SE and SR measurement spots may be evaluated at instances that are simultaneous with SE and SR measurements.

In some embodiments, the beam path of the alignment beam is separate from the beam path of the SE subsystem, the SR subsystem, or both. In these embodiments, the alignment measurement channel is separate from the metrology measurement channels, thus reducing cross-talk between the alignment and metrology measurement channels. In some of these embodiments, alignment measurements are performed simultaneous with metrology measurements. In some of these embodiments, alignment measurements are performed while a wafer move is performed, thus further improving measurement throughput.

In another further aspect, the location of a known metrology target in the SE measurement spot is estimated directly based on SE measurements of the known metrology target, and the location of the known metrology target in the SR measurement spot is estimated directly based on SR measurements of the known metrology target.

In some embodiments, SE/SR colocation is evaluated directly based on spectral measurements of a known metrology target that provides a spectral response having a known dependency on alignment with the measurement system. In some examples, the metrology target is a two dimensional, spatially varying pattern target, such as a two dimensional variable period grating or a variable wavelength filter. In the embodiment depicted in FIG. 1, a known metrology target is measured by SE subsystem 105 and SR subsystem 106. Computing system 130 estimates the location of a known metrology target in the SE measurement spot 108 based on signals 103, and estimates the location of the known metrology target in the SR measurement spot 137 based on signals 102.

In yet another further aspect, the alignment of the SR measurement spot with the SE measurement spot is achieved by maximizing cross-talk between the SE and SR measurement channels during measurement of a specialized metrology target.

In some embodiments, the alignment of the SR measurement spot with the SE measurement spot is achieved by adjusting the location of incidence of SE illumination at the wafer to maximize a spectral signal detected by the SR detector in response to illumination of a specialized target by the SE illumination source. The specialized target is designed to diffract a significant amount of SE illumination light into the SR measurement channel (e.g., diffract one or more orders greater than zero order into the SR measurement channel).

In yet another further aspect, the location of a metrology target in the SE measurement spot is estimated directly based on a statistical model of SE measurements of a metrology target, and the location of the known metrology target in the SR measurement spot is estimated directly based on a statistical model of SR measurements of the metrology target.

In some embodiments, statistical models of SE and SR measurements are trained with measurement data generated using only one measurement subsystem at a time. In one example, a SE statistical model calibration dataset is generated by moving a metrology target with respect to the SE subsystem 105 in two or three degrees of freedom in a programmed manner. In some examples, the metrology target is moved in the two dimensions aligned with the plane of the wafer 101 (e.g., $\{x,y\}$ directions). In some examples, the metrology target is moved in the two dimensions aligned with the plane of wafer 101 and the dimension normal to the wafer surface (e.g., $\{x,y,z\}$). At each programmed stage position, SE detector signals are recorded for the full set of measured wavelengths, polarizer/compensator rotation cycles, etc. While these SE measurements are performed, the SR illumination source 120 is off. Computing system 130 generates a conditional probability model of the SE detector signals $Prob(SE_{Meas}|\cdot)$ associated with the measured locations of the metrology target ($\theta=\{x_{Meas},y_{Meas},z_{Meas}\}$) for discrete-valued detector signals. For continuous-valued detector signals, the probability is expressed as a probability density function.

Similarly, a SR statistical model calibration dataset is generated by moving a metrology target with respect to the SR subsystem 106 in two or three degrees of freedom in a programmed manner. At each programmed stage position, SR detector signals are recorded for the full set of measured wavelengths, etc. While these SR measurements are performed, the SE illumination source 110 is off. Computing system 130 generates a conditional probability model of the SR detector signals $Prob(SR_{Meas}|\theta)$ associated with the measured locations of the metrology target ($\theta=\{x_{Meas},y_{Meas},z_{Meas}\}$).

Based on the conditional probability models associated with the SE and SR calibration measurements, computing system 130 generates a likelihood model for independent SE observations, $L(\theta|SE_{Meas})$, and a likelihood model for independent SR observations, $L(\theta|SR_{Meas})$. After generating the likelihood models, the location of a metrology target in the SE measurement spot is estimated based on the likelihood model for independent SE observations, $L(\theta|SE_{Meas})$, and the location of the metrology target in the SR measurement spot is estimated based on the likelihood model for independent SR observations, $L(\theta|SR_{Meas})$. The maximum likelihood estimate of the location of the metrology target in the SE measurement spot, denoted as, $\hat{\theta}_{SE}$, is the SE position where the likelihood is maximized, i.e., $\hat{\theta}_{SE}=\arg\max_\theta(Prob(SE_{Meas}|\theta))$. Similarly, the estimated location of the metrology target in the SR measurement spot, $\hat{\theta}_{SR}$, is the SR position value with the maximum likelihood, i.e., $\hat{\theta}_{SR}=\arg\max_\theta(Prob(SR_{Meas}|\theta))$. In addition, computing system 130 determines the misalignment between the estimated locations of the metrology target in the SE and SR measurement spots, determines whether the misalignment exceeds a predetermined threshold value, and communicates control commands to one or more elements of SE subsystem 105, SR subsystem 105, or both, to reduce the misalignment below the predetermined threshold value as described herein.

In some embodiments, statistical models of SE and SR measurements are trained with measurement data generated using both measurement subsystems at the same time. In one example, a SE statistical model calibration dataset is generated by moving a metrology target with respect to the SE subsystem 105 in two or three degrees of freedom in a programmed manner. At each programmed stage position, SE detector signals are recorded for the full set of measured wavelengths, polarizer/compensator rotation cycles, etc. While these SE measurements are performed, the SR illumination source 120 is on. Computing system 130 generates a conditional probability model of the SE detector signals $Prob(SE_{Meas}|\theta)$ associated with the measured locations of the metrology target ($\theta=\{x_{Meas},y_{Meas},z_{Meas}\}$).

Similarly, a SR statistical model calibration dataset is generated by moving a metrology target with respect to the SR subsystem 106 in two or three degrees of freedom in a programmed manner. At each programmed stage position, SR detector signals are recorded for the full set of measured wavelengths, etc. While these SR measurements are performed, the SE illumination source 110 is on. Computing system 130 generates a conditional probability model of the SR detector signals $Prob(SR_{Meas}|\theta)$ associated with the measured locations of the metrology target ($\theta=\{x_{Meas},y_{Meas},z_{Meas}\}$).

In addition, computing system 130 generates a covariance model of the SE and SR calibration measurements, $K((SE_{Meas},SR_{Meas})|\theta)$, associated with the measured locations of the metrology target ($\theta=\{x_{Meas},y_{Meas},z_{Meas}\}$).

Based on the conditional probability models associated with the SE and SR calibration measurements and the covariance model of the SE and SR calibration measurements, computing system 130 generates a likelihood model for SE observations, $L(\theta|SE_{Meas})$, and a likelihood model for SR observations, $L(\theta|SR_{Meas})$ that incorporates the joint variability of SE and SR measurements. After generating the likelihood models, the location of a metrology target in the SE measurement spot is estimated based on the likelihood model for SE observations, $L(\theta|SE_{Meas})$, and the location of the metrology target in the SR measurement spot is estimated based on the likelihood model for SR observations, $L(\theta|SR_{Meas})$. The estimated location of the metrology target in the SE measurement spot is the SE position value with the maximum likelihood. Similarly, the estimated location of the metrology target in the SR measurement spot is the SR position value with the maximum likelihood. In addition, computing system 130 determines the misalignment between the estimated locations of the metrology target in the SE and SR measurement spots, determines whether the misalignment exceeds a predetermined threshold value, and communicates control commands to one or more elements of SE subsystem 105, SR subsystem 106, or both, to reduce the misalignment below the predetermined threshold value as described herein.

In another aspect, misalignment between the SE and SR measurement spots is corrected by adjusting a field stop of the SE subsystem, SR subsystem, or both. In this manner, XY colocation of SR and SE field images (i.e., colocation within the wafer plane) is achieved by active positioning of SE field stops, SR field stops, or both, in a plane perpendicular to the measurement beam path. In a further aspect, focus of the SE and SR measurement spots is also corrected by adjusting a field stop of the SE subsystem, SR subsystem, or both. In this manner, Z colocation of the SR and SE field images (i.e., colocation perpendicular to the wafer plane) is achieved by active positioning of SE field stops, SR field stops, or both, in a direction aligned with the measurement beam path.

Figure 2:
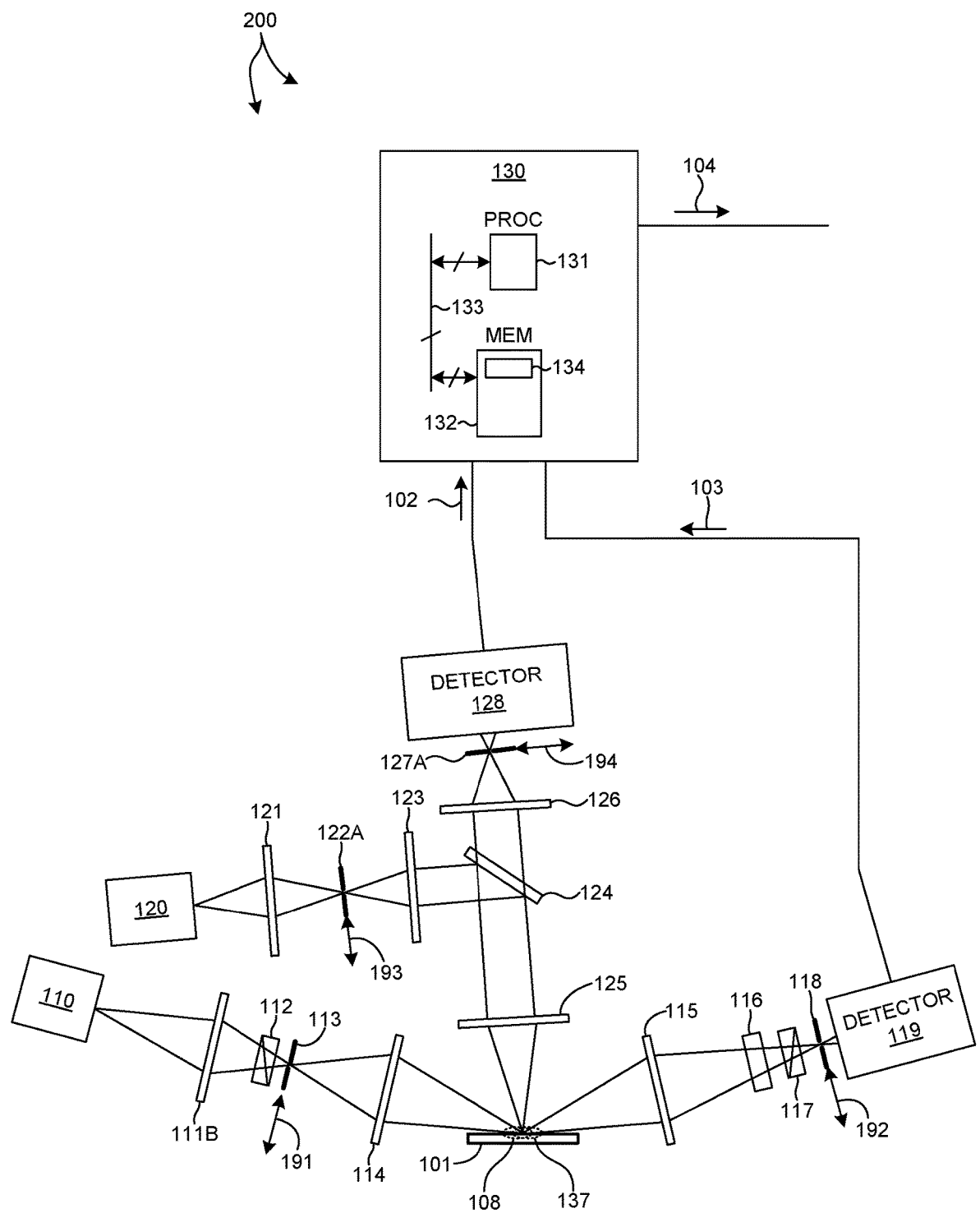
FIG. 2 depicts an exemplary, metrology system 200 for performing colocated measurements of semiconductor structures by multiple metrology subsystems in another embodiment.

FIG. 2 depicts an exemplary, combined SE-SR metrology system 200 for performing SE and SR measurements of semiconductor structures. Like numbered elements described with reference to FIG. 1 are analogous. As depicted in FIG. 2, SE illumination field stop 113 is actively positioned by actuator subsystem 191, SE collection field stop 118 is actively positioned by actuator subsystem 192, SE illumination field stop 122A is actively positioned by actuator subsystem 193, and SE collection field stop 127A is actively positioned by actuator subsystem 194. Actuator subsystems 191, 192, 193, and 194 actively position each associated field stop based on command signals (not shown) received from computing system 130.

In some embodiments, the XY location of SE measurement spot 108 is adjusted with respect to wafer 101 by movement of SE illumination field stop 113. In one embodiment, computing system 130 communicates control signals to actuator subsystem 191, which adjusts the location of illumination field stop 113 in a plane perpendicular to the direction of illumination beam propagation to achieve the desired XY location of the SE measurement spot 108 with respect to the metrology target under measurement. In a further embodiment, computing system 130 communicates control signals to actuator subsystem 192, which adjusts the location of SE collection field stop 118 to achieve the desired XY location of the SE field image with respect to the metrology target under measurement.

In some embodiments, the location of SR measurement spot 137 is adjusted with respect to wafer 101 by movement of SR illumination field stop 122A. In one embodiment, computing system 130 communicates control signals to actuator subsystem 193, which adjusts the location of illumination field stop 122A in a plane perpendicular to the direction of illumination beam propagation to achieve the desired XY location of the SR measurement spot 137 with respect to the metrology target under measurement. In a further embodiment, computing system 130 communicates control signals to actuator subsystem 194, which adjusts the location of SR collection field stop 127A to achieve the desired XY location of the SR field image with respect to the metrology target under measurement.

In a further embodiment, computing system 130 communicates control signals to actuator subsystems 191, 192, 193, and 194 to actively position each associated field stop in the direction of beam propagation to achieve a desired focus of the SE beam, SR beam, or both, with respect to the metrology target under measurement.

In another aspect, misalignment between the SE and SR measurement spots is corrected by adjusting an illumination pupil of the SR subsystem. In this manner, XY colocation of SR and SE field images is achieved by active positioning of an SR pupil by one or more actuators (not shown). In another aspect, any of illumination sources 110, 120, field stops 113, 118, 122A, 127A, detectors 119, 128, or combinations thereof, move in XYZ to achieve desired end-to-end alignment.

Figure 3:
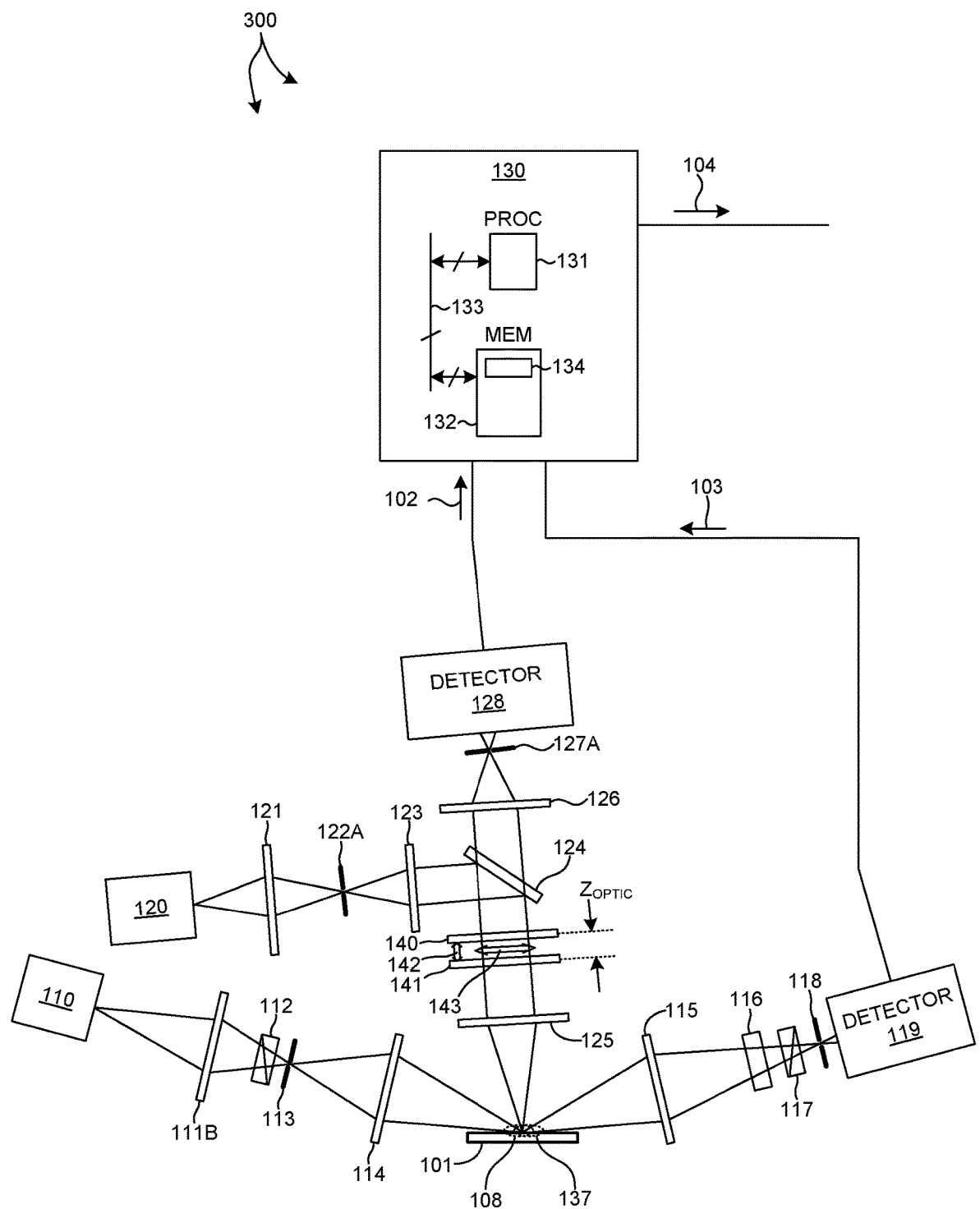
FIG. 3 depicts an exemplary, metrology system 300 for performing colocated measurements of semiconductor structures by multiple metrology subsystems in another embodiment.

FIG. 3 depicts an exemplary, combined SE-SR metrology system 300 for performing SE and SR measurements of semiconductor structures. Like numbered elements described with reference to FIG. 1 are analogous. As depicted in FIG. 3, focusing optical elements 140 and 141 are disposed in the SR optical path between beam splitter 124 and objective 125. The focusing optical elements 140 and 141 are actively positioned in a plane perpendicular to the direction of beam propagation by actuator subsystem 143, and actively positioned in a direction aligned with beam propagation by actuator subsystem 142. Actuator subsystems 142 and 143 actively position optical elements 140 and 141 based on command signals (not shown) received from computing system 130.

In some embodiments, the location of SR measurement spot 137 is adjusted with respect to wafer 101 by a movement of focusing optical elements 140 and 141 in a plane perpendicular to the direction of beam propagation. By effectively, de-centering focusing optical elements 140 and 141, a shift in the direction of beam propagation is induced, which shifts the location of incidence of SR measurement spot 137 on wafer 101. In one embodiment, computing system 130 communicates control signals to actuator subsystem 143, which adjusts the location of focusing optical elements 140 and 141 in a plane perpendicular to the direction of illumination beam propagation to achieve the desired location of the SR measurement spot 137 with respect to the metrology target under measurement. In a further embodiment, computing system 130 communicates control signals to actuator subsystem 142, which adjusts the relative location of focusing optical elements 141 and 142 in the direction of beam propagation to achieve a desired focus of the SR illumination beam with respect to the metrology target under measurement.

Focusing optical elements 140 and 141 are illustrated as transmissive optical elements in FIG. 3. Alternatively, however, focusing optical elements 140 and 141 may be implemented as reflective focusing optical elements.

Figure 4:
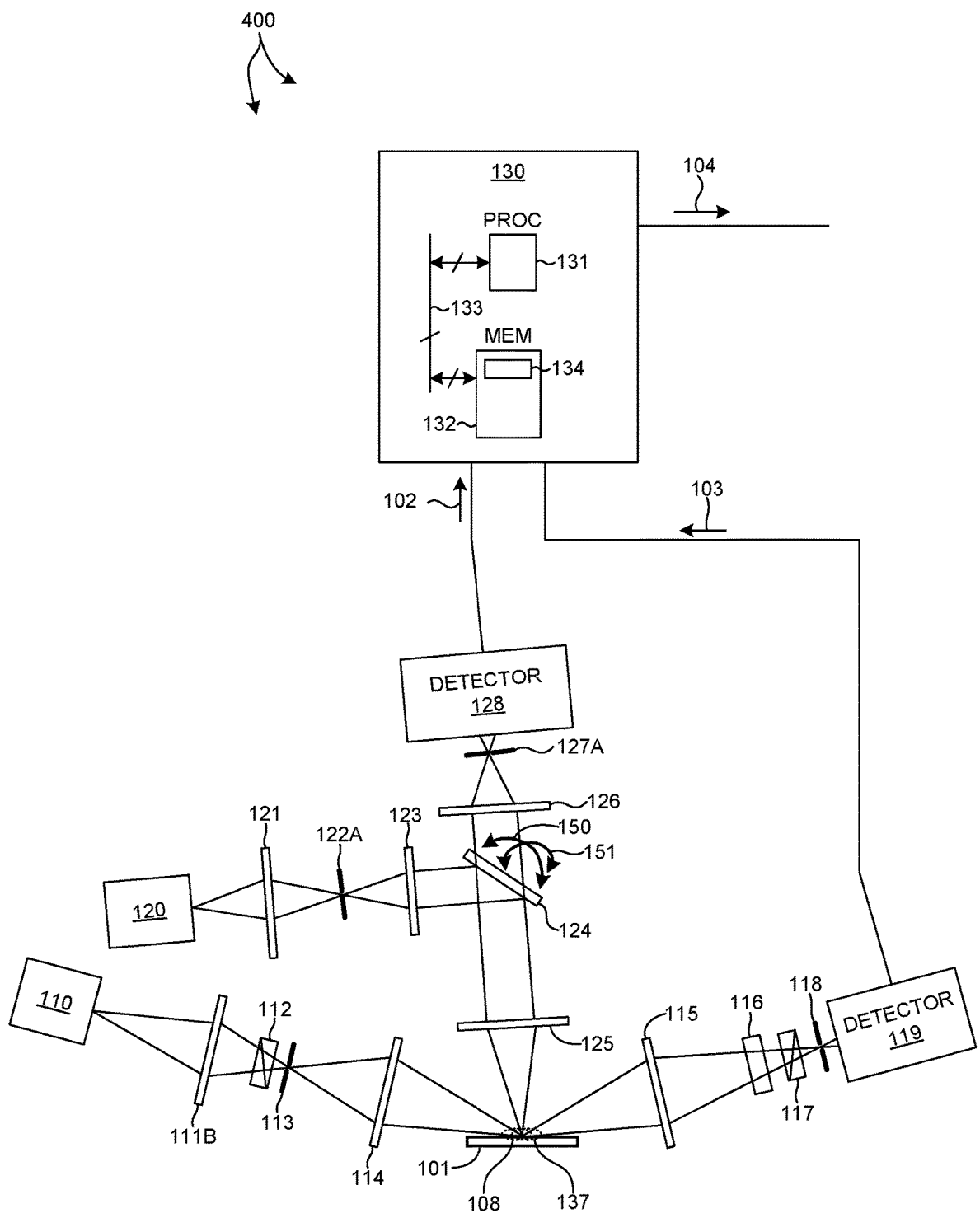
FIG. 4 depicts an exemplary, metrology system 400 for performing colocated measurements of semiconductor structures by multiple metrology subsystems in another embodiment.

FIG. 4 depicts an exemplary, combined SE-SR metrology system 400 for performing SE and SR measurements of semiconductor structures. Like numbered elements described with reference to FIG. 1 are analogous. As depicted in FIG. 4, tip-tilt actuator subsystems 150 and 151 actively orient beam splitter 124 with respect to wafer 101. Actuator subsystems 150 and 151 actively position beam splitter 124 based on command signals (not shown) received from computing system 130.

In some embodiments, the location of SR measurement spot 137 is adjusted with respect to wafer 101 by a rotation of beam splitter 124 about axes of rotation parallel to the plane of incidence of SR illumination beam on beam splitter 124. By rotating beam splitter 124, a shift in the direction of beam propagation is induced, which shifts the location of incidence of SR measurement spot 137 on wafer 101. In one embodiment, computing system 130 communicates control signals to actuator subsystems 150 and 151, which adjusts the orientation of beam splitter 124 with respect to the incident SR illumination beam. The rotation induces a shift in the direction of illumination beam propagation to achieve the desired location of the SR measurement spot 137 with respect to the metrology target under measurement.

In a further embodiment, a compensating plate located in the SR collection beam path is also actively rotated to ensure alignment of the SR collection beam with detector 128.

Figure 5:
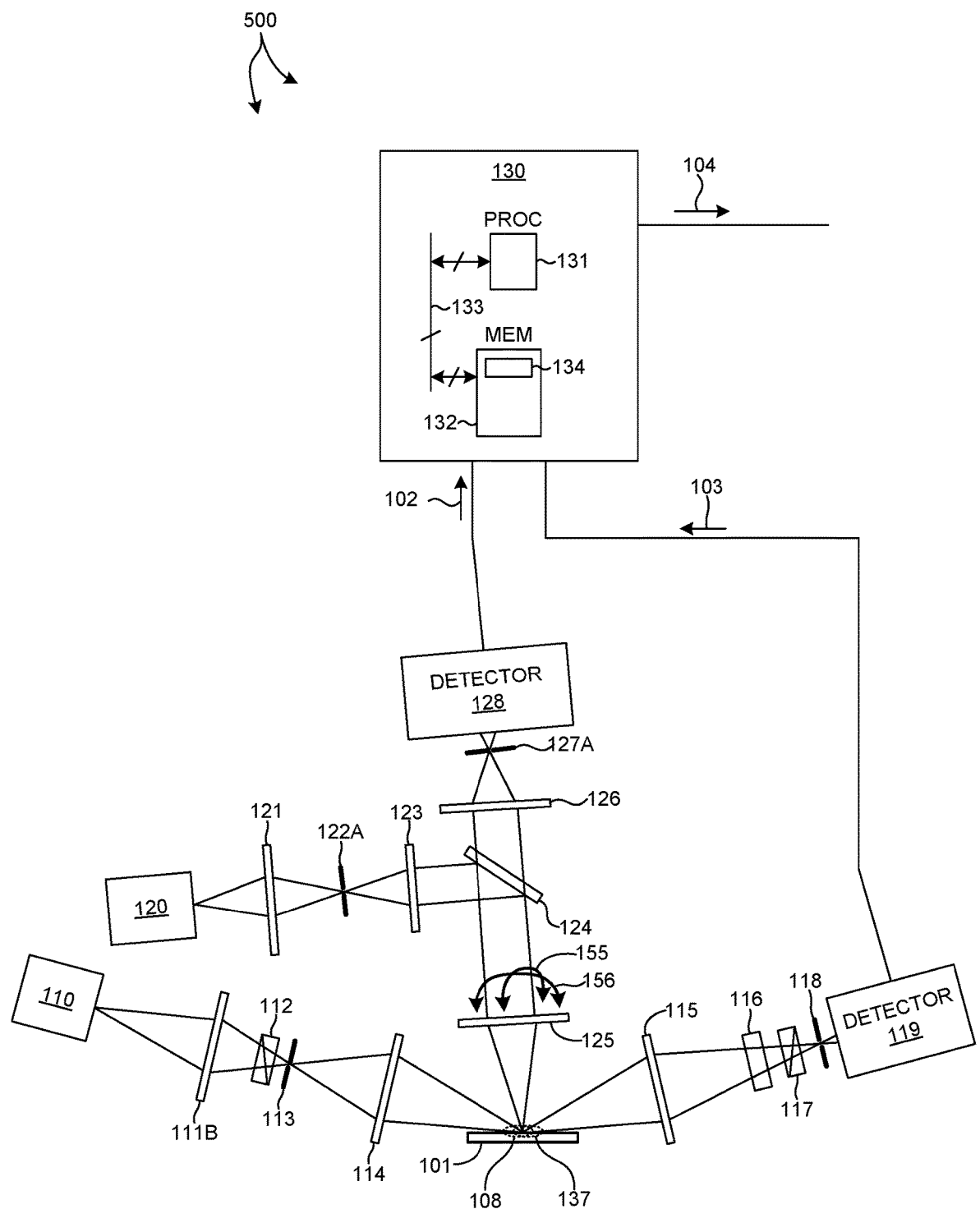
FIG. 5 depicts an exemplary, metrology system 500 for performing colocated measurements of semiconductor structures by multiple metrology subsystems in another embodiment.

FIG. 5 depicts an exemplary, combined SE-SR metrology system 500 for performing SE and SR measurements of semiconductor structures. Like numbered elements described with reference to FIG. 1 are analogous. As depicted in FIG. 5, tip-tilt actuator subsystems 155 and 156 actively orient objective 125 with respect to wafer 101. Actuator subsystems 155 and 156 actively position objective 125 based on command signals (not shown) received from computing system 130.

In some embodiments, the location of SR measurement spot 137 is adjusted with respect to wafer 101 by a rotation of objective 125 about axes of rotation perpendicular to the direction of SR beam propagation. By rotating objective 125, a shift in the direction of beam propagation is induced, which shifts the location of incidence of SR measurement spot 137 on wafer 101. In one embodiment, computing system 130 communicates control signals to actuator subsystems 155 and 156, which adjusts the orientation of objective 125 with respect to wafer 101. The rotation induces a shift in the direction of illumination beam propagation to achieve the desired location of the SR measurement spot 137 with respect to the metrology target under measurement. In a further embodiment, computing system 130 communicates control signals to an actuator subsystem (not shown), which adjusts the relative location of objective 125 with respect to wafer 101 in the direction of beam propagation to achieve a desired focus of the SR illumination beam with respect to the metrology target under measurement.

Figure 6:
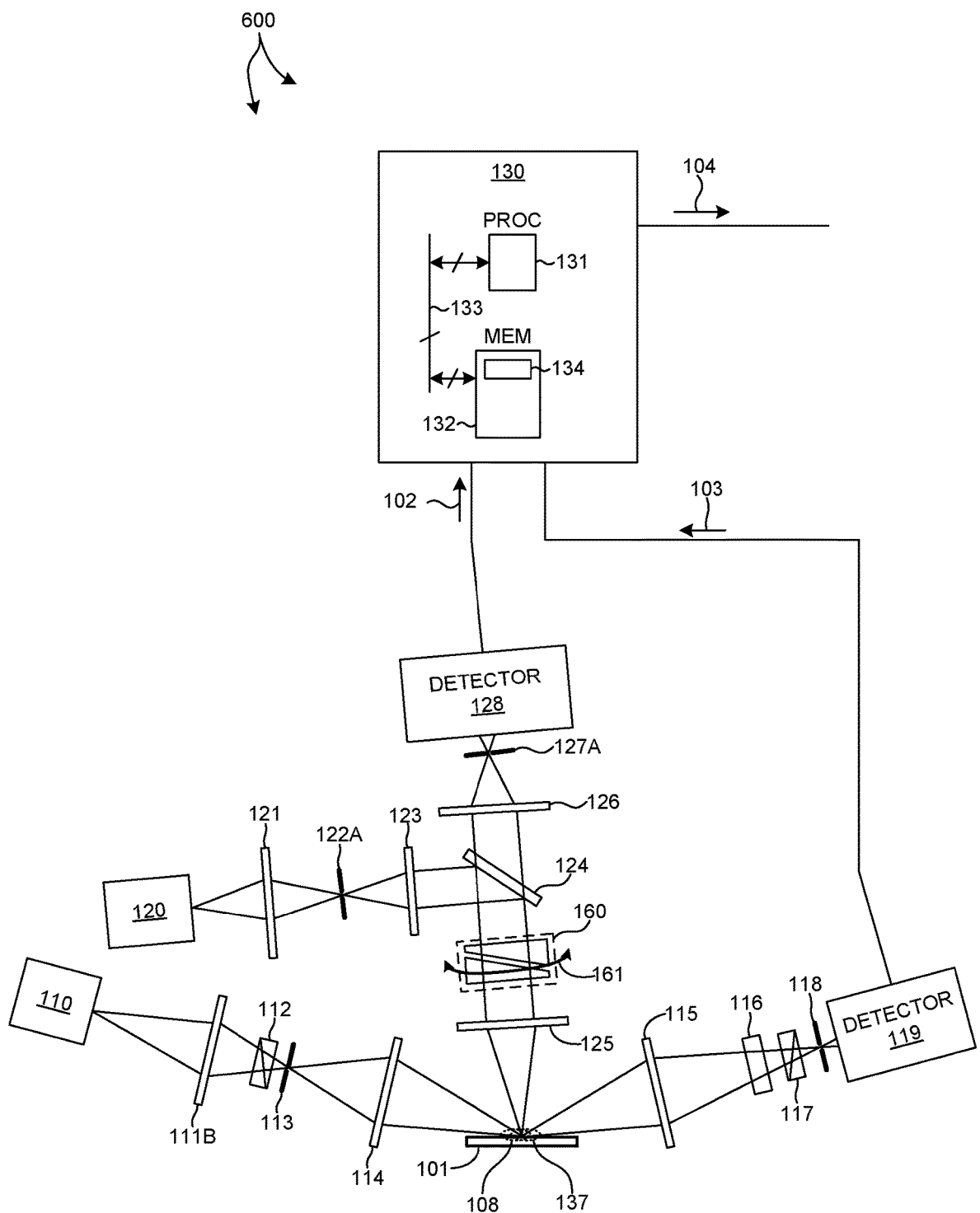
FIG. 6 depicts an exemplary, metrology system 600 for performing colocated measurements of semiconductor structures by multiple metrology subsystems in another embodiment.

FIG. 6 depicts an exemplary, combined SE-SR metrology system 600 for performing SE and SR measurements of semiconductor structures. Like numbered elements described with reference to FIG. 1 are analogous. As depicted in FIG. 6, rotary actuator subsystem 161 actively orients Risley prism 160 with respect to wafer 101. Actuator subsystem 161 actively positions Risley prism 160 based on command signals (not shown) received from computing system 130.

In some embodiments, the location of SR measurement spot 137 is adjusted with respect to wafer 101 by a rotation of Risley prism 160 about an axis of rotation parallel to the direction of SR beam propagation. By rotating Risley prism 160, a shift in the direction of beam propagation is induced, which shifts the location of incidence of SR measurement spot 137 on wafer 101. In one embodiment, computing system 130 communicates control signals to actuator subsystem 161, which adjusts the orientation of Risley prism 160 with respect to wafer 101. The rotation induces a shift in the direction of illumination beam propagation to achieve the desired location of the SR measurement spot 137 with respect to the metrology target under measurement.

In some embodiments, objective 125 is located between wafer 101 and an optical element (e.g., a mirror, Risley prism, etc.) located in a pupil plane. In a further aspect, the optical element is actuated to tip/tilt the pupil (i.e., shift the direction of beam propagation). Objective 125 transforms the shift in direction of beam propagation into an XY displacement of the beam at wafer 101. In this manner, control of tip/tilt at the pupil is employed to achieve the desired location of the SR measurement spot 137 with respect to the metrology target under measurement.

In general, computing system 130 is configured to receive an indication of the location of a metrology target in the SE field image and the location of the same metrology target in the SR field image in accordance with any of the monitoring techniques described herein. Furthermore, computing system 130 is configured to determine a misalignment between the locations of the metrology target in the SE and SR field images, and whether the misalignment exceeds a predetermined tolerance. In addition, computing system 130 is configured to communicate command signals to one or more elements of the SE subsystem, the SR subsystem, or both, to automatically adjust positioning of one or more optical elements to co-locate the metrology target in the SE and SR field images within the predetermined tolerance as described herein. In this manner, computing system 130 achieves SE-SR colocation in an automated manner (without intervention of a human operator) using closed-loop feedback.

In some embodiments, SE and SR measurements are performed sequentially without intervening stage moves after SE/SR colocation is achieved as described herein. However, in preferred embodiments, SE and SR measurements are performed simultaneously after SE/SR colocation is achieved as described herein. This approach is advantageous because simultaneous SE and SR measurements are performed with reduced photon load on wafer compared to sequential measurements. This reduces the potential for damage to the wafer, which is becoming a more significant issue as illumination sources required to perform metrology today and in the future are increasingly more powerful. Unfortunately, co-located, simultaneous SE and SR measurements of a metrology target are prone to cross-contamination of measurement signals across the SE and SR measurement channels.

In another aspect, SE measurement signals present in the SR measurement channel are decoupled from the SR measurement signals, and SR measurement signals present in the SE measurement channel are decoupled from the SE measurement signals. In this manner, cross-contamination of measurement signals across the SE and SR measurement channels is effectively mitigated.

In a further aspect, a deep learning model (e.g., neural network model, support vector machines model, etc.) is trained to reduce crosstalk between signals simultaneously measured on the SE and SR measurement channels. Model training may be based on actual measurement data, synthetic measurement data (i.e., simulated measurement data), or both.

In some embodiments, the deep learning model is trained based on SE measurement data and SR measurement data associated with simultaneous measurements of the same metrology target. In some of these embodiments, the parameter(s) of interest (e.g., critical dimensions, overlay, etc.) associated with the measured metrology target are known. In these embodiments, the SR and SE measurement signals are treated as input training data and the known values of the parameters of interest (e.g., critical dimensions, overlay, etc.) are treated as output training data.

In some other embodiments, the parameter(s) of interest (e.g., critical dimensions, overlay, etc.) associated with the measured metrology target are unknown. In some of these embodiments, the value(s) of the parameter(s) of interest are estimated based on measurements of the metrology target performed only with the SE measurement channel (i.e., the SR illumination source is turned off), measurements of the metrology target performed only with the SR measurement channel (i.e., the SE illumination source is turned off), or both. In some of these embodiments, the SR and SE measurement signals are treated as input training data and the estimated values of the parameters of interest (e.g., critical dimensions, overlay, etc.) are treated as output training data.

The trained deep learning model estimates value(s) of parameter(s) of interest based on SE and SR signals simultaneously measured on the SE and SR measurement channels. The SE and SR signals are treated as input data and the output of the trained deep learning model is the estimated value(s) of the parameter(s) of interest.

In another further aspect, illumination intensity modulation and filtering is employed to decouple simultaneously measured SE and SR signals present at the detectors of the SE and SR measurement channels. SR signals present on the SE measurement channel and SE signals present on the SR measurement channel are discarded, thus reducing crosstalk between the SE and SR measurement channels.

In some embodiments, the intensity of the SE illumination beam and the intensity of the SR illumination beam are each temporally modulated at distinct frequencies. In some embodiments, an optical chopper is located in the SE illumination beam path, the SR illumination beam path, or both. In one embodiment, an optical chopper is configured to modulate the intensity of the SE illumination beam at a particular temporal frequency, and the SR illumination beam is not modulated at all. In another embodiment, an optical chopper is configured to modulate the intensity of the SR illumination beam at a particular temporal frequency, and the SE illumination beam is not modulated at all. In another embodiment, an optical chopper is configured to modulate the intensity of the SE illumination beam at a particular temporal frequency, and another optical chopper is configured to modulate the intensity of the SR illumination beam at a different temporal frequency.

In some embodiments, the SE illumination source, the SR illumination source, or both, are pulsed illumination sources, and the pulse frequency of the SE measurement channel and the pulse frequency of the SR measurement channel are different frequencies.

In some other embodiments, the SE measurement channel includes one or more rotating polarizing elements, and the SR measurement channel does not include rotating polarizing elements. In these embodiments, the rotating polarizing element in the SE measurement channel causes the SE measurement signals detected at the detector to vary with time. But, the SR measurement signals do not vary with time (i.e., zero frequency SR measurement signals). In some other embodiments, the SE measurement channel includes one or more rotating polarizing elements, and the SR measurement channel also includes one or more rotating polarizing elements. The angular velocity of the one or more rotating polarizing elements of the SE measurement channel is different from the angular velocity of the one or more rotating polarizing elements of the SR measurement channel.

The modulation frequencies of the SE and SR measurement channels are sufficiently separated in the frequency domain to ensure that the signal contribution associated with each measurement channel is resolved independently by available filtering techniques.

In some embodiments, an electronic filter operates on the detected signals of the SE measurement channel and another electronic filter operates on the detected signals of the SR measurement channel. The electronic filters process the respective signals to remove the contribution from unwanted frequency components belonging to the channel to be filtered.

In some embodiments, a digital filter operates on the detected signals of the SE measurement channel and another digital filter operates on the detected signals of the SR measurement channel. The digital filters process the respective signals to remove the contribution from unwanted frequency components belonging to the channel to be filtered. Each digital filter implements an appropriate mathematical algorithm in hardware, firmware, or software to remove the contribution from unwanted frequency components belonging to the channel to be filtered.

In another further aspect, separate illumination wavelengths are employed to decouple simultaneously measured SE and SR signals present at the detectors of the SE and SR measurement channels. SR signals present on the SE measurement channel and SE signals present on the SR measurement channel are discarded, thus reducing crosstalk between the SE and SR measurement channels.

In one example, one or more Fabry-Perot interferometers or other devices are located in the SR and SE measurement paths to generate comb spectra in both the SE and SR illumination paths. The SR spectrum and the SE spectrum are effectively interleaved and do not overlap at any particular wavelength. This creates spectral separation between the SR and SE measurement signals at each detector. In a preferred embodiment, the one or more Fabry-Perot interferometers or other devices are located in the SR and SE illumination paths to reduce irradiance on the wafer.

In another aspect, the location of a metrology target in an SE field image and the location of the metrology target in an SR field image are colocated at all times based on the mechanical alignment and stability of the combined SE/SR metrology system.

In some embodiments, the SE objective and the SR objective are fabricated as part of an athermalized, monolithic structure that is insensitive to thermal variations. In some examples, the structure is fabricated such that mechanical movements induced by thermal variations are along directions that do not induce movement of either the SE field image or the SR field image. In some examples, the structure is fabricated such that mechanical movements induced by thermal variations cancel one another such that no movement of either the SE field image or the SR field image is induced.

In some embodiments, optical and structural elements of the SE objective and the SR objective are fabricated from materials having a very low coefficient of thermal expansion (e.g., zerodur, invar, etc.).

In some embodiments, optical elements of the SE measurement channel and the SR measurement channel are aligned during manufacturing to optimize both the SE and SR wavefronts together.

In another further aspect, diffraction orders greater than zero are collected in the SR collection path from illumination provided by the SE illumination path, and vice-versa. In some examples, the non-zero diffraction orders include asymmetry information such as overlay, etch tilt, etc. In these embodiments, a specialized metrology targets including a large pitch structure, or a particular device structure including a large pitch are preferred.

Figure 7:
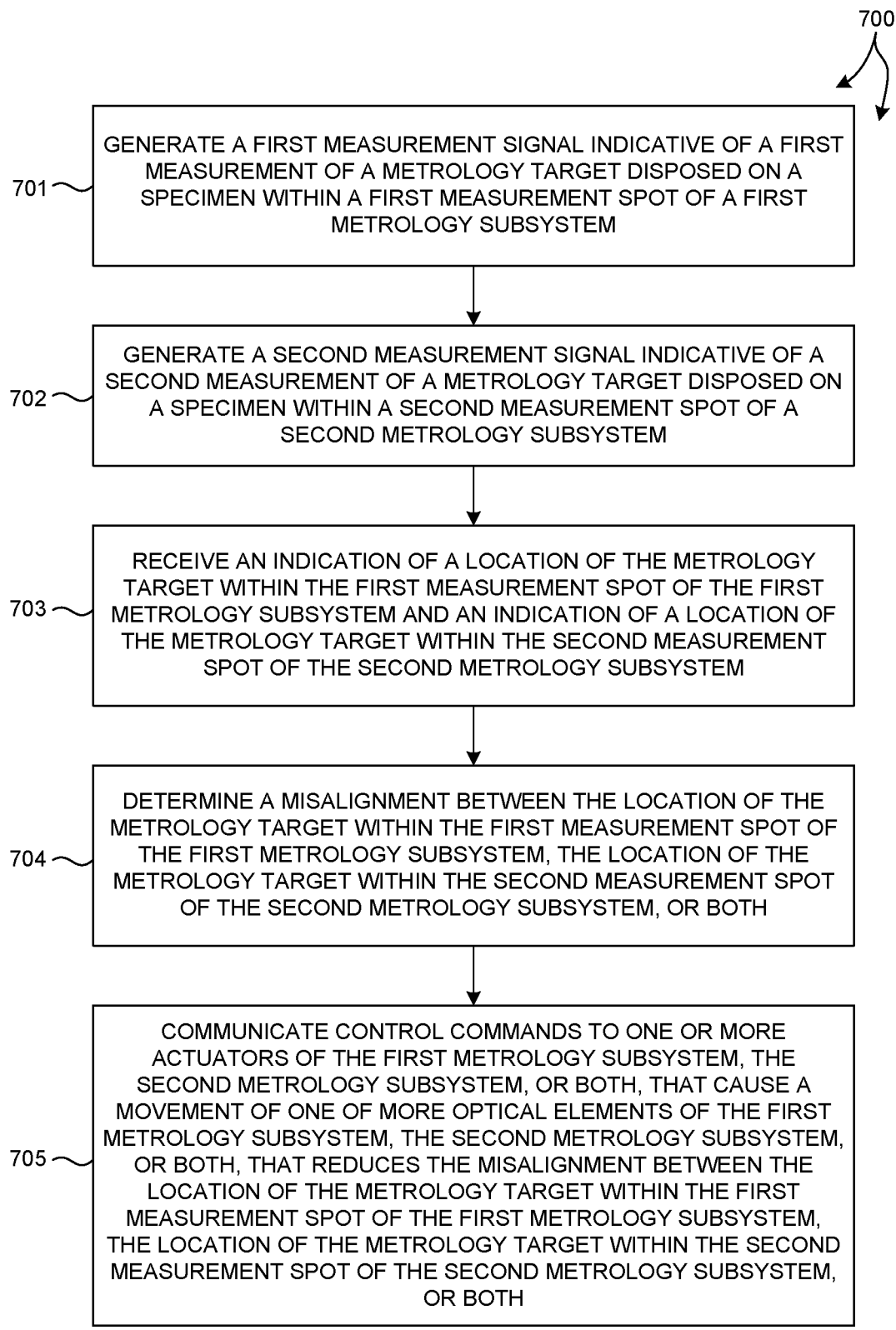
FIG. 7 illustrates a method 700 of performing colocated measurements by multiple metrology subsystems in at least one novel aspect as described herein.

FIG. 7 illustrates a method 700 of performing collocated spectroscopic measurements in at least one novel aspect. Method 700 is suitable for implementation by a metrology system such as metrology systems 100, 200, 300, 400, 500, and 600 of the present invention. In one aspect, it is recognized that data processing blocks of method 700 may be carried out via a pre-programmed algorithm executed by one or more processors of computing system 130, or any other general purpose computing system. It is recognized herein that the particular structural aspects of metrology systems 100, 200, 300, 400, 500, and 600 do not represent limitations and should be interpreted as illustrative only.

In block 701, a first measurement signal indicative of a first measurement of a metrology target disposed on a specimen within a first measurement spot of a first metrology subsystem is generated.

In block 702, a second measurement signal indicative of a second measurement of a metrology target disposed on a specimen within a second measurement spot of a second metrology subsystem is generated.

In block 703, an indication of a location of the metrology target within the first measurement spot of the first metrology subsystem and an indication of a location of the metrology target within the second measurement spot of the second metrology subsystem are received.

In block 704, determine a misalignment between the location of the metrology target within the first measurement spot of the first metrology subsystem, the location of the metrology target within the second measurement spot of the second metrology subsystem, or both.

In block 705, communicate control commands to one or more actuators of the first metrology subsystem, the second metrology subsystem, or both, that cause a movement of one of more optical elements of the first metrology subsystem, the second metrology subsystem, or both, that reduces the misalignment between the location of the metrology target within the first measurement spot of the first metrology subsystem, the location of the metrology target within the second measurement spot of the second metrology subsystem, or both.

Although FIGS. 1-6 describe specific embodiments of metrology systems including a SE subsystem and a SR subsystem, in general, the collocated measurement techniques described herein apply to any combination of two or more metrology subsystems. Exemplary metrology subsystems that may be colocated as described herein include, but are not limited to, spectroscopic ellipsometry (SE), including Mueller matrix ellipsometry (MMSE), rotating polarizer SE (RPSE), rotating polarizer, rotating compensator SE (RPRC), rotating compensator, rotating compensator SE (RCRC), spectroscopic reflectometry (SR), including polarized SR, unpolarized SR, spectroscopic scatterometry, scatterometry overlay, angle resolved reflectometry, polarization resolved reflectometery, beam profile reflectometry, beam profile ellipsometry, single or multiple discrete wavelength ellipsometry, etc. Exemplary measurement techniques that may be colocated as described herein further include measurement techniques that employ optical illumination, soft x-ray illumination, hard x-ray illumination, etc. Furthermore, exemplary measurement techniques that may be colocated as described herein further include image based metrology techniques and hyperspectral imaging based metrology techniques. For example, colocation of any SR or SE technique applicable to the characterization of semiconductor structures, as well as any image based metrology technique, hyperspectral imaging based metrology technique, or both, may be contemplated, individually, or in any combination. In some embodiments, multiple measurement subsystems employing the same metrology technique, but at different system settings, are collocated as described herein. For example, a metrology system may include two SE subsystems each configured to perform measurements of a metrology target at different azimuth angles.

In a further embodiment, system 100 includes one or more computing systems 130 employed to perform measurements of actual device structures based on spectroscopic measurement data collected in accordance with the methods described herein. The one or more computing systems 130 may be communicatively coupled to the spectrometer. In one aspect, the one or more computing systems 130 are configured to receive measurement data 170 associated with measurements of the structure of specimen 120.

It should be recognized that one or more steps described throughout the present disclosure may be carried out by a single computer system 130 or, alternatively, a multiple computer system 130. Moreover, different subsystems of system 100 may include a computer system suitable for carrying out at least a portion of the steps described herein. Therefore, the aforementioned description should not be interpreted as a limitation on the present invention but merely an illustration.

In addition, the computer system 130 may be communicatively coupled to the spectrometers in any manner known in the art. For example, the one or more computing systems 130 may be coupled to computing systems associated with the spectrometers. In another example, the spectrometers may be controlled directly by a single computer system coupled to computer system 130.

The computer system 130 of metrology system 100 may be configured to receive and/or acquire data or information from the subsystems of the system (e.g., spectrometers and the like) by a transmission medium that may include wireline and/or wireless portions. In this manner, the transmission medium may serve as a data link between the computer system 130 and other subsystems of system 100.

Computer system 130 of metrology system 100 may be configured to receive and/or acquire data or information (e.g., measurement results, modeling inputs, modeling results, reference measurement results, etc.) from other systems by a transmission medium that may include wireline and/or wireless portions. In this manner, the transmission medium may serve as a data link between the computer system 130 and other systems (e.g., memory on-board metrology system 100, external memory, or other external systems). For example, the computing system 130 may be configured to receive measurement data from a storage medium (i.e., memory 132 or an external memory) via a data link. For instance, spectral results obtained using the spectrometers described herein may be stored in a permanent or semi-permanent memory device (e.g., memory 132 or an external memory). In this regard, the spectral results may be imported from on-board memory or from an external memory system. Moreover, the computer system 130 may send data to other systems via a transmission medium. For instance, a measurement model or an estimated parameter value 171 determined by computer system 130 may be communicated and stored in an external memory. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions 134 stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In some examples, the measurement models are implemented as an element of a SpectraShape® optical critical-dimension metrology system available from KLA-Tencor Corporation, Milpitas, Calif., USA. In this manner, the model is created and ready for use immediately after the spectra are collected by the system.

In some other examples, the measurement models are implemented off-line, for example, by a computing system implementing AcuShape® software available from KLA-Tencor Corporation, Milpitas, Calif., USA. The resulting, trained model may be incorporated as an element of an AcuShape® library that is accessible by a metrology system performing measurements.

In another aspect, the methods and systems for spectroscopic metrology of semiconductor devices described herein are applied to the measurement of high aspect ratio (HAR) structures, large lateral dimension structures, or both. The described embodiments enable optical critical dimension (CD), film, and composition metrology for semiconductor devices including three dimensional NAND structures, such as vertical-NAND (V-NAND) structures, dynamic random access memory structures (DRAM), etc., manufactured by various semiconductor manufacturers such as Samsung Inc. (South Korea), SK Hynix Inc. (South Korea), Toshiba Corporation (Japan), and Micron Technology, Inc. (United States), etc. These complex devices suffer from low light penetration into the structure(s) being measured. A spectroscopic ellipsometer with broadband capability and wide ranges of AOI, azimuth angle, or both, having simultaneous spectral band detection as described herein is suitable for measurements of these high-aspect ratio structures. HAR structures often include hard mask layers to facilitate etch processes for HARs. As described herein, the term "HAR structure" refers to any structure characterized by an aspect ratio that exceeds 10:1 and may be as high as 100:1, or higher.

In yet another aspect, the measurement results described herein can be used to provide active feedback to a process tool (e.g., lithography tool, etch tool, deposition tool, etc.). For example, values of measured parameters determined based on measurement methods described herein can be communicated to a lithography tool to adjust the lithography system to achieve a desired output. In a similar way etch parameters (e.g., etch time, diffusivity, etc.) or deposition parameters (e.g., time, concentration, etc.) may be included in a measurement model to provide active feedback to etch tools or deposition tools, respectively. In some example, corrections to process parameters determined based on measured device parameter values and a trained measurement model may be communicated to a lithography tool, etch tool, or deposition tool.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including measurement applications such as critical dimension metrology, overlay metrology, focus/dosage metrology, and composition metrology. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from the calibration of system parameters based on critical dimension data.

Various embodiments are described herein for a semiconductor measurement system that may be used for measuring a specimen within any semiconductor processing tool (e.g., an inspection system or a lithography system). The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous SiO2. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A metrology system comprising:
   a first metrology subsystem comprising:
   one or more illumination sources configured to generate a first amount of illumination light;
   an illumination optics subsystem configured to direct the first amount of illumination light from the one or more illumination sources to a first measurement spot on a surface of a specimen under measurement as a first illumination beam;
   a collection optics subsystem configured to collect an amount of light from the first measurement spot; and
   a detector that receives the amount of collected light and generates a first measurement signal indicative of a first measurement of a metrology target disposed on the specimen within the first measurement spot;
   a second metrology subsystem comprising:
   one or more illumination sources configured to generate a second amount of illumination light;
   an illumination optics subsystem configured to direct the second amount of illumination light from the one or more illumination sources to a second measurement spot on the surface of the specimen under measurement as a second illumination beam;
   a collection optics subsystem configured to collect an amount of light from the second measurement spot; and
   a detector that receives the amount of collected light and generates a second measurement signal indicative of a second measurement of the metrology target disposed on the specimen within the second measurement spot; and
   a computing system configured to:
   receive an indication of a location of the metrology target within the first measurement spot of the first metrology subsystem and an indication of a location of the metrology target within the second measurement spot of the second metrology subsystem, wherein the metrology target is a known metrology target, wherein the indication of the location of the metrology target within the measurement spot of the first subsystem is the first measurement signal, and wherein the indication of the location of the metrology target within the measurement spot of the second subsystem is the second measurement signal;
   determine a misalignment between the location of the metrology target within the first measurement spot of the first metrology subsystem, the location of the metrology target within the second measurement spot of the second metrology subsystem, or both; and
   communicate control commands to one or more actuators of the first metrology subsystem, the second metrology subsystem, or both, that cause a movement of one of more optical elements of the first metrology subsystem, the second metrology subsystem, or both, that reduces the misalignment between the location of the metrology target within the first measurement spot of the first metrology subsystem, the location of the metrology target within the second measurement spot of the second metrology subsystem, or both.

2. The metrology system of claim 1, further comprising:
   a first field imaging device disposed at or near a field image plane of the first metrology subsystem, wherein the field imaging device captures a first field image associated with the first metrology subsystem, wherein the first field image is indicative of the location of the metrology target within the first measurement spot of the first metrology subsystem; and
   a second field imaging device disposed at or near a field image plane of the second metrology subsystem, wherein the second field imaging device captures a second field image associated with the second metrology subsystem, wherein the second field image is indicative of the location of the metrology target within the second measurement spot of the second metrology subsystem.

3. The metrology system of claim 2, wherein the one or more illumination sources of the first metrology subsystem illuminate the metrology target when the first field imaging device captures the first field image; and wherein the one or more illumination devices of the second metrology subsystem illuminate the metrology target when the second field imaging device captures the second field image.

4. The metrology system of claim 2, further comprising:
   an alignment beam source configured to generate an alignment beam that illuminates the metrology target when the first field imaging device captures the first field image, the second field imaging device captures the second field image, or both.

5. The metrology system of claim 4, wherein the alignment beam source is a laser alignment source.

6. The metrology system of claim 4, wherein the alignment beam is separated from the first illumination beam, the second illumination beam, or both, by wavelength.

7. The metrology system of claim 4, wherein the alignment beam is spatially separated from the first illumination beam, the second illumination beam, or both.

8. The metrology system of claim 4, wherein the alignment beam is temporally separated from the first illumination beam, the second illumination beam, or both.

9. The metrology system of claim 8, wherein the alignment beam is temporally separated from the first illumination beam, the second illumination beam, or both, by optical modulation.

10. The metrology system of claim 1, wherein the metrology target directs a portion of the first illumination beam to the detector of the second metrology subsystem, and wherein the optical adjustment of the first metrology subsystem, the second metrology subsystem, or both, maximizes the second measurement signal detected by the detector of the second metrology subsystem in response to illumination of the metrology target by the first illumination beam.

11. The metrology system of claim 1, wherein the computing system is further configured to:
   estimate the location of the metrology target within the first measurement spot based on a trained statistical model of the first measurement of the metrology target; and estimate the location of the metrology target within the second measurement spot based on a trained statistical model of the second measurement of the metrology target.

12. The metrology system of claim 1, wherein the optical adjustment of the first metrology subsystem, the second metrology subsystem, or both, involves adjusting a location of a field stop of the first metrology subsystem, a field stop of the second metrology subsystem, or both.

13. The metrology system of claim 12, wherein the adjusting of the location of the field stop of the first metrology subsystem is in a direction aligned with a measurement beam passing through the field stop.

14. The metrology system of claim 1, wherein the optical adjustment of the first metrology subsystem, the second metrology subsystem, or both, involves adjusting an illumination pupil of the first metrology subsystem, an illumination pupil of the second metrology subsystem, or both.

15. The metrology system of claim 1, wherein the optical adjustment of the second metrology subsystem involves adjusting a location of a focusing optical element located in a beam path of the second metrology subsystem in a direction perpendicular to a direction of propagation of the second illumination beam.

16. The metrology system of claim 1, wherein the optical adjustment of the second metrology subsystem involves adjusting an orientation of a beam splitting element located in a beam path of the second metrology subsystem.

17. The metrology system of claim 1, wherein the optical adjustment of the second metrology subsystem involves adjusting an orientation of an objective lens located in a beam path of the second metrology subsystem.

18. The metrology system of claim 1, wherein the optical adjustment of the second metrology subsystem involves adjusting an orientation of a Risley prism located in a beam path of the second metrology subsystem.

19. The metrology system of claim 1, wherein the first measurement of the metrology target and the second measurement of the metrology target are performed simultaneously.

20. The metrology system of claim 19, the computing system further configured to:
decouple measurement signals associated with the second metrology subsystem from measurement signals associated with the first metrology subsystem detected by the detector of the first metrology subsystem based on a trained deep learning model; and
decouple measurement signals associated with the first metrology subsystem from measurement signals associated with the second metrology subsystem detected by the detector of the second metrology subsystem based on the trained deep learning model.

21. The metrology system of claim 19, further comprising:
an optical modulator located in a path of the first illumination beam, the optical modulator modulates an intensity of the first illumination beam at a frequency or range of frequencies that is distinct from any modulation of intensity of the second illumination beam; and
a filter that removes frequency components from the first measurement signals outside the frequency or range of frequencies associated with the modulation of the intensity of the first illumination beam.

22. The metrology system of claim 21, wherein the optical modulator is any of an optical chopper, a rotating polarizing element in an optical path of the first metrology subsystem, and a pulsed illumination source of the first metrology subsystem.

23. The metrology system of claim 19, further comprising:
an optical modulator located in a path of the second illumination beam, the optical modulator modulates an intensity of the second illumination beam at a frequency or range of frequencies that is distinct from any modulation of intensity of the first illumination beam; and
a filter that removes frequency components from the second measurement signals outside the frequency or range of frequencies associated with the modulation of the intensity of the second illumination beam.

24. The metrology system of claim 23, wherein the optical modulator is any of an optical chopper, a rotating polarizing element in an optical path of the second metrology subsystem, and a pulsed illumination source of the second metrology subsystem.

25. The metrology system of claim 19, wherein wavelengths of the first illumination beam are distinct from wavelengths of the second illumination beam, the metrology system further comprising:
a first optical filter that removes wavelengths from the second measurement signals outside the wavelengths associated with the second illumination beam; and
a second optical filter that removes wavelengths from the first measurement signals to remove wavelengths outside the wavelengths associated with the first illumination beam.

26. The metrology system of claim 1, wherein the first illumination beam and the second illumination beam each include a range of wavelengths including infrared, visible, and ultraviolet wavelengths.

27. The metrology system of claim 1, wherein the computing system is further configured to:
generate an estimated value of a parameter of interest of the metrology target based on the first measurement signals and the second measurement signals.

28. The metrology system of claim 1, wherein the first metrology subsystem is a spectroscopic ellipsometer, and wherein the second metrology subsystem is a reflectometer.

29. The metrology system of claim 28, wherein the reflectometer is an angle resolved reflectometer, and wherein the illumination source of the angle resolved reflectometer is a broadband illumination source, and wherein the second illumination light is broadband illumination light.

30. The metrology system of claim 29, wherein the broadband illumination source of the angle resolved reflectometer is a laser based illumination source.

31. The metrology system of claim 29, the illumination optics of the angle resolved reflectometer, further comprising:
one or more narrowband filters configured to filter the second illumination light.

32. The metrology system of claim 1, wherein the first metrology subsystem is a spectroscopic ellipsometer configured to measure the metrology target at a first azimuth angle, and wherein the second metrology subsystem is a spectroscopic ellipsometer configured to measure the metrology target at a second azimuth angle different from the first azimuth angle.

33. The metrology system of claim 1, wherein the first metrology subsystem is a spectroscopic ellipsometer, and wherein the second metrology subsystem is an imaging based metrology system, a hyperspectral imaging based metrology system, or both.

34. A metrology system comprising:
- a first metrology subsystem configured to generate a first measurement signal indicative of a first measurement of a metrology target disposed on a specimen within a first measurement spot of the first metrology subsystem;
- a second metrology subsystem configured to generate a second measurement signal indicative of a second measurement of the metrology target disposed on the specimen within a second measurement spot of the second metrology subsystem;
- a first field imaging device disposed at or near a field image plane of the first metrology subsystem, wherein the first field imaging device captures a first field image indicative of the location of the metrology target within the first measurement spot of the first metrology subsystem;
- a second field imaging device disposed at or near a field image plane of the second metrology subsystem, wherein the second field imaging device captures a second field image indicative of the location of the metrology target within the second measurement spot of the second metrology subsystem; and
- a computing system configured to:
  - communicate control commands to the first metrology subsystem, the second metrology subsystem, or both, that cause an optical adjustment of the first metrology subsystem, the second metrology subsystem, or both, that reduces a misalignment between the location of the metrology target within the first measurement spot of the first metrology subsystem and the location of the metrology target within the second measurement spot of the second metrology subsystem.

35. The metrology system of claim 34, further comprising:
- an alignment beam source configured to generate an alignment beam that illuminates the metrology target when the first field imaging device captures the first field image, the second field imaging device captures the second field image, or both.

36. The metrology system of claim 34, wherein the optical adjustment of the first metrology subsystem, the second metrology subsystem, or both, involves adjusting a location of a field stop of the first metrology subsystem, a field stop of the second metrology subsystem, or both.

37. The metrology system of claim 36, wherein the adjusting of the location of the field stop of the first metrology subsystem is in a direction aligned with a measurement beam passing through the field stop.

38. The metrology system of claim 34, wherein the optical adjustment of the first metrology subsystem, the second metrology subsystem, or both, involves adjusting an illumination pupil of the first metrology subsystem, an illumination pupil of the second metrology subsystem, or both.

39. The metrology system of claim 34, wherein the optical adjustment of the second metrology subsystem involves adjusting a location of a focusing optical element located in a beam path of the second metrology subsystem in a direction perpendicular to a direction of propagation of the second illumination beam.

40. The metrology system of claim 34, wherein the optical adjustment of the second metrology subsystem involves adjusting an orientation of a beam splitting element located in a beam path of the second metrology subsystem.

41. The metrology system of claim 34, wherein the optical adjustment of the second metrology subsystem involves adjusting an orientation of an objective lens located in a beam path of the second metrology subsystem.

42. The metrology system of claim 34, wherein the optical adjustment of the second metrology subsystem involves adjusting an orientation of a Risley prism located in a beam path of the second metrology subsystem.

43. The metrology system of claim 34, wherein the first measurement of the metrology target and the second measurement of the metrology target are performed simultaneously.

44. The metrology system of claim 34, wherein the first metrology subsystem is a spectroscopic ellipsometer, and wherein the second metrology subsystem is a reflectometer, an imaging based metrology subsystem, or a hyperspectral imaging based metrology subsystem.

45. A method comprising:
- generating a first measurement signal indicative of a first measurement of a metrology target disposed on a specimen within a first measurement spot of a first metrology subsystem;
- generating a second measurement signal indicative of a second measurement of a metrology target disposed on a specimen within a second measurement spot of a second metrology subsystem;
- estimating a location of the metrology target within the first measurement spot based on a trained statistical model of the first measurement of the metrology target;
- estimating the location of the metrology target within the second measurement spot based on a trained statistical model of the second measurement of the metrology target;
- determining a misalignment between the location of the metrology target within the first measurement spot of the first metrology subsystem, the location of the metrology target within the second measurement spot of the second metrology subsystem, or both; and
- communicating control commands to one or more actuators of the first metrology subsystem, the second metrology subsystem, or both, that cause a movement of one or more optical elements of the first metrology subsystem, the second metrology subsystem, or both, that reduces the misalignment between the location of the metrology target within the first measurement spot of the first metrology subsystem, the location of the metrology target within the second measurement spot of the second metrology subsystem, or both.

46. The method of claim 45, further comprising:
- capturing a first field image associated with the first metrology subsystem, wherein the first field image is indicative of the location of the metrology target within the first measurement spot of the first metrology subsystem; and
- capturing a second field image associated with the second metrology subsystem, wherein the second field image is indicative of the location of the metrology target within the second measurement spot of the second metrology subsystem.

47. The method of claim 46, further comprising:
- generating an alignment beam that illuminates the metrology target during the capturing of the first field image.

48. The method of claim 45, wherein the metrology target is a known metrology target, wherein the indication of the location of the metrology target within the measurement spot of the first subsystem is the first measurement signal, and wherein the indication of the location of the metrology target within the measurement spot of the second subsystem is the second measurement signal.

49. The method of claim 45, wherein the optical adjustment of the first metrology subsystem, the second metrology subsystem, or both, involves adjusting a location of a field stop of the first metrology subsystem, a field stop of the second metrology subsystem, or both.

50. The method of claim 49, wherein the adjusting of the location of the field stop of the first metrology subsystem is in a direction aligned with a measurement beam passing through the field stop.

51. The method of claim 45, wherein the optical adjustment of the first metrology subsystem, the second metrology subsystem, or both, involves adjusting an illumination pupil of the first metrology subsystem, an illumination pupil of the second metrology subsystem, or both.

52. The method of claim 45, wherein the optical adjustment of the second metrology subsystem involves adjusting a location of a focusing optical element located in a beam path of the second metrology subsystem.

53. The method of claim 45, wherein the optical adjustment of the second metrology subsystem involves adjusting an orientation of a beam splitting element located in a beam path of the second metrology subsystem.

54. The method of claim 45, wherein the optical adjustment of the second metrology subsystem involves adjusting an orientation of an objective lens located in a beam path of the second metrology subsystem.

55. The method of claim 45, wherein the optical adjustment of the second metrology subsystem involves adjusting an orientation of a Risley prism located in a beam path of the second metrology subsystem.

56. The method of claim 45, wherein the first measurement of the metrology target and the second measurement of the metrology target are performed simultaneously.

57. The method of claim 56, further comprising:
decoupling measurement signals associated with the second metrology subsystem from measurement signals associated with the first metrology subsystem detected by the detector of the first metrology subsystem based on a trained deep learning model; and
decoupling measurement signals associated with the first metrology subsystem from measurement signals associated with the second metrology subsystem detected by the detector of the second metrology subsystem based on the trained deep learning model.

58. The method of claim 56, further comprising:
modulating an intensity of a first illumination beam of the first metrology subsystem at a frequency or range of frequencies that is distinct from any modulation of intensity of a second illumination beam of the second metrology subsystem; and
filtering frequency components from the first measurement signals outside the frequency or range of frequencies associated with the modulation of the intensity of the first illumination beam.

59. The method of claim 56, further comprising:
filtering wavelengths from the second measurement signals outside the wavelengths associated with a second illumination beam of the second metrology subsystem; and
filtering wavelengths from the first measurement signals outside the wavelengths associated with a first illumination beam of the first metrology subsystem, wherein wavelengths of the first illumination beam are distinct from wavelengths of the second illumination beam.

60. The method of claim 45, wherein the first metrology subsystem is a spectroscopic ellipsometer, and wherein the second metrology subsystem is a reflectometer.

61. The method of claim 45, wherein the first metrology subsystem is a spectroscopic ellipsometer configured to measure the metrology target at a first azimuth angle, and wherein the second metrology subsystem is a spectroscopic ellipsometer configured to measure the metrology target at a second azimuth angle different from the first azimuth angle.

62. The method of claim 45, wherein the first metrology subsystem is a spectroscopic ellipsometer, and wherein the second metrology subsystem is an imaging based metrology system, a hyperspectral imaging subsystem, or both.

63. A metrology system comprising:
a first metrology subsystem comprising:
one or more illumination sources configured to generate a first amount of illumination light;
an illumination optics subsystem configured to direct the first amount of illumination light from the one or more illumination sources to a first measurement spot on a surface of a specimen under measurement as a first illumination beam;
a collection optics subsystem configured to collect an amount of light from the first measurement spot; and
a detector that receives the amount of collected light and generates a first measurement signal indicative of a first measurement of a metrology target disposed on the specimen within the first measurement spot;
a second metrology subsystem comprising:
one or more illumination sources configured to generate a second amount of illumination light;
an illumination optics subsystem configured to direct the second amount of illumination light from the one or more illumination sources to a second measurement spot on the surface of the specimen under measurement as a second illumination beam;
a collection optics subsystem configured to collect an amount of light from the second measurement spot; and
a detector that receives the amount of collected light and generates a second measurement signal indicative of a second measurement of the metrology target disposed on the specimen within the second measurement spot; and
a computing system configured to:
receive an indication of a location of the metrology target within the first measurement spot of the first metrology subsystem and an indication of a location of the metrology target within the second measurement spot of the second metrology subsystem;
determine a misalignment between the location of the metrology target within the first measurement spot of the first metrology subsystem, the location of the metrology target within the second measurement spot of the second metrology subsystem, or both; and
communicate control commands to one or more actuators of the first metrology subsystem, the second metrology subsystem, or both, that cause a movement of one or more optical elements of the first metrology subsystem, the second metrology subsystem, or both, that reduces the misalignment between the location of the metrology target within the first measurement spot of the first metrology subsystem, the location of the metrology target within the second measurement spot of the second metrology subsystem, or both, wherein the metrology target directs a portion of the first illumination beam to the detector of the second metrology subsystem, and wherein the movement of one or more optical elements of the first metrology subsystem, the second metrology subsystem, or both, maximizes the second measurement signal detected by the detector of the second metrology subsystem in response to illumination of the metrology target by the first illumination beam.

* * * * *